(12) United States Patent
Benaissa et al.

(10) Patent No.: US 8,405,154 B2
(45) Date of Patent: Mar. 26, 2013

(54) LOW COST TRANSISTORS USING GATE ORIENTATION AND OPTIMIZED IMPLANTS

(75) Inventors: Kamel Benaissa, Dallas, TX (US); Greg C. Baldwin, Plano, TX (US); Shaofeng Yu, Plano, TX (US); Shashank S. Ekbote, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/167,538

(22) Filed: Jun. 23, 2011

(65) Prior Publication Data

US 2011/0248347 A1    Oct. 13, 2011

Related U.S. Application Data

(62) Division of application No. 12/492,743, filed on Jun. 26, 2009.

(51) Int. Cl.
*H01L 21/70* (2006.01)

(52) U.S. Cl. .................. 257/368; 438/584; 257/E27.06

(58) Field of Classification Search .................. 257/368, 257/E27.06; 438/301, 584, 527, 519
See application file for complete search history.

(56) References Cited

U.S. PATENT DOCUMENTS

| 5,925,914 A | 7/1999 | Jiang et al. |
| 5,963,809 A | 10/1999 | Duane et al. |
| 2001/0046740 A1 | 11/2001 | Kim et al. |
| 2010/0244147 A1* | 9/2010 | Yang et al. .................. 257/408 |

* cited by examiner

*Primary Examiner* — Chuong A Luu
*Assistant Examiner* — Nga Doan
(74) *Attorney, Agent, or Firm* — Jacqueline J. Garner; Wade J. Brady, III; Frederick J. Telecky, Jr.

(57) ABSTRACT

An integrated circuit is disclosed having symmetric and asymmetric MOS transistors of the same polarity, oriented perpendicularly to each other, formed by concurrent halo ion, LDD ion and/or S/D ion implant processes using angled, rotated sub-implants which vary the tilt angle, dose and/or energy between rotations. Implanted halo, LDD and/or S/D source and drain regions formed by angled subimplants may have different extents of overlap with, or lateral separation from, gates of the two types of transistors, producing transistors with two different sets of electrical properties. A process for concurrently fabricating the two types of transistors is also disclosed. Specific embodiments of processes for concurrently forming symmetric and asymmetric transistors are disclosed.

3 Claims, 16 Drawing Sheets

LOW COST TRANSISTORS USING GATE ORIENTATION AND OPTIMIZED IMPLANTS

CROSS-REFERENCE TO RELATED APPLICATIONS

This application is a divisional of and claims the benefit of U.S. patent application Ser. No. 12/492,743, filed Jun. 26, 2009 entitled LOW COST TRANSISTORS USING GATE ORIENTATION AND OPTIMIZED IMPLANTS, referenced and incorporated herein.

The following application is related and is hereby incorporated by reference: U.S. patent application Ser. No. 12/492,818, filed Jun. 26, 2009, entitled LOW COST SYMMETRIC TRANSISTORS (now ABANDONED).

FIELD OF THE INVENTION

This invention relates to the field of integrated circuits. More particularly, this invention relates to MOS transistors in integrated circuits.

BACKGROUND OF THE INVENTION

Integrated circuits frequently have several types of metal oxide semiconductor (MOS) transistors, each type having certain electrical properties. For example, an integrated circuit may have logic transistors which perform binary arithmetic and/or Boolean logic functions at high speed, input/output (I/O) transistors which commonly operate at higher voltages than the logic transistors and interface with signals transmitted to and from the integrated circuit, transistors in analog circuits, and drain extended transistors, which may interface with power supplies such as batteries connected to the integrated circuit. MOS transistors are fabricated using ion implantation processes to form n-type and p-type ion implanted regions in the MOS transistors, having halo regions, lightly doped drain (LDD) regions or medium doped drain (MDD) regions, and source/drain (S/D) regions. Details of spatial configurations of ion implanted regions, such as lateral extents of overlap or separation between the ion implanted regions and gates of the MOS transistors, affect the electrical properties of the MOS transistors. Other physical properties of the ion implanted regions, having doping densities and dopant species, also affect the electrical properties of the MOS transistors. MOS transistors designed to have different electrical properties frequently have different spatial configurations of ion implanted regions, and may also have different doping densities and different distributions of dopant species.

Ion implanted regions are typically formed using photoresist patterns which expose areas on integrated circuits to be implanted. The photoresist patterns are removed during subsequent processing. Forming and removing photoresist patterns undesirably increases fabrication cost and complexity of integrated circuits.

SUMMARY OF THE INVENTION

The instant invention provides an integrated circuit having at least two types of MOS transistors of the same polarity, such that longitudinal axes of gates of a first type of MOS transistors are perpendicular to the longitudinal axes of gates of a second type of MOS transistors. Concurrent halo ion implant processes, LDD ion implant processes and/or S/D ion implant processes are performed using angled, rotated subimplants which vary the tilt angle, dose and/or energy between rotations. The implant processes are performed so that a first type of MOS transistor receives symmetric implants in its source and drain regions while a second type receives asymmetric implants in its source and drain regions. Implanted halo, LDD and/or S/D source and drain regions formed by the subimplants are symmetric in the one first type of MOS transistor and may have different extents of overlap with, or lateral separation from, gates in the second type of transistor. Thus, a symmetric set of transistors and an asymmetric set of transistors may be formed concurrently using a common set photoresist patterns and ion implant processes, advantageously reducing fabrication cost and complexity of the integrated circuit.

DETAILED DESCRIPTION

Figure 1A:
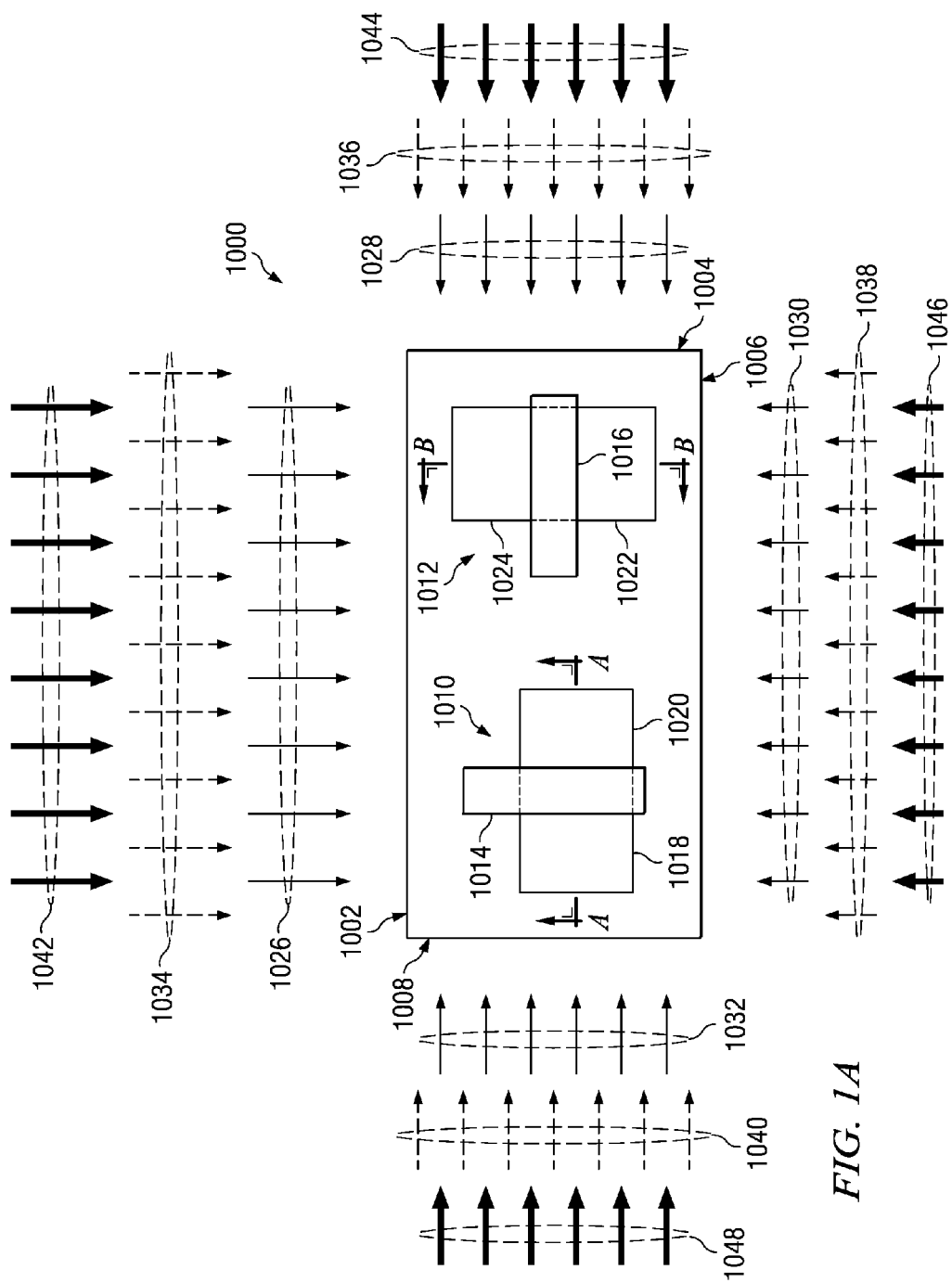
FIG. 1A through FIG. 1C depict an integrated circuit having a symmetric MOS transistor and an asymmetric MOS transistor formed according to an embodiment of the instant invention.

The present invention is described with reference to the attached figures, such that like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be conceptualized as a rectangular solid in which metal oxide semiconductor (MOS) transistors and other components are formed on a top surface of the rectangular solid. An integrated circuit may be assigned an orientation, based on a layout of components in the integrated circuit or other consideration, so that one edge of the top surface of the integrated circuit may be identified as an upper edge, and an opposite edge of the upper surface may be identified as a lower edge, such that the lower edge is parallel to the upper edge. A right edge may be identified as that edge of the top surface which is perpendicular to the upper edge and the lower edge, and which connects to a right-hand end of the upper edge and to a right-hand end of the lower edge. Correspondingly, a left edge may be identified as that edge of the top surface which is perpendicular to the upper edge and the lower edge, is opposite the right edge, and which connects to a left-hand end of the upper edge and to a left-hand end of the lower edge. Proceeding in a clockwise direction around a perimeter of the top surface, starting with the upper edge, one encounters the right edge, subsequently the lower edge and finally the left edge. For the purposes of this disclosure, the term "upper direction" is understood to mean a direction in the top surface toward the upper edge. Similarly, for the purposes of this disclosure, the term "upper side" of an element is understood to mean a lateral side of the element facing the upper edge or closer to the upper edge than other lateral sides of the element. For the purposes of this disclosure, the term "right direction" is understood to mean a direction in the top surface toward the right edge. Similarly, for the purposes of this disclosure, the term "right side" of an element such as a gate of an MOS transistor is understood to mean a lateral side of the element facing the right edge or closer to the right edge than other lateral sides of the element. For the purposes of this disclosure, the term "lower direction" is understood to mean a direction in the top surface toward the lower edge. Similarly, for the purposes of this disclosure, the term "lower side" of an element is understood to mean a lateral side of the element facing the lower edge or closer to the lower edge than other lateral sides of the element. For the purposes of this disclosure, the term "left direction" is understood to mean a direction in the top surface toward the left edge. Similarly, for the purposes of this disclosure, the term "left side" of an element is understood to mean a lateral side of the element facing the left edge or closer to the left edge than other lateral sides of the element.

An MOS transistor on a top surface of an integrated circuit has a gate, a source region adjacent to one side of the gate, and a drain region adjacent to the gate opposite the source region. Charged carriers flow in the MOS transistor from the source region under the gate to the drain region. A longitudinal axis of the gate is identified as an axis in the gate, parallel to the top surface of the integrated circuit, perpendicular to the direction of charged carrier flow. For example, an MOS transistor in which charged carriers flow in the upper direction has a gate with a left-right longitudinal axis. Similarly, an MOS transistor in which charged carriers flow in the left direction has a gate with an upper-lower longitudinal axis.

To assist reading of this disclosure, source/drain extensions commonly known as lightly doped drain (LDD) or medium doped drain (MDD) regions will collectively be referred to as LDD regions.

The instant invention provides an integrated circuit having at least two types of MOS transistors of a same polarity, that is both types of MOS transistors are NMOS or both types of MOS transistors are PMOS. Longitudinal axes of gates of the first type of MOS transistors are all parallel to each other. Longitudinal axes of the second type of MOS transistors are all parallel to each other, and are perpendicular to the longitudinal axes of the gates of the first type of MOS transistors. Both types of MOS transistors are formed using halo ion implant processes, LDD ion implant processes and/or S/D ion implant processes, resulting in symmetric source and drain regions in one of the types of transistor and asymmetric source and drain regions in the other type of transistor. Each ion implant process forms an ion implanted layer at a top surface of the integrated circuit. Ion implanted regions in each transistor include the ion implanted layer, bounded by gates of the transistor and field oxide or other isolation structure. Halo implanted regions of the first type of MOS transistors and of the second type of MOS transistors, and/or LDD implanted regions of the first type of MOS transistors and of the second type of MOS transistors, and/or source drain (S/D) implanted regions of the first type of MOS transistors and of the second type of MOS transistors are formed using common photoresist patterns and ion implant processes which are divided into one or more angled sub-implants. Each sub-implant may be angled from a perpendicular axis to a top surface of the integrated circuit toward a different direction in the integrated circuit. For example, a halo implant may be performed in four sub-implants, with a first sub-implant angled toward the upper direction, a second sub-implant angled toward the right direction, a third sub-implant angled toward the lower direction, and a fourth sub-implant angled toward the left direction. In another example, an LDD implant may be performed in two sub-implants, with a first sub-implant angled toward the upper direction, and a second sub-implant angled toward the lower direction. In a further example, an S/D implant may be performed in one sub-implant angled toward the left direction. Implanted halo, LDD and S/D regions formed by angled subimplants according to the instant invention have different extents of overlap with, or lateral separation from, gates of the two types of transistors. Thus, symmetric transistors and asymmetric transistors with two different sets of electrical properties may be formed concurrently using a common set photoresist patterns and ion implant processes, advantageously reducing fabrication cost and complexity of the integrated circuit. To assist the reading of this disclosure, halo ion implanted regions are assumed to be p-type in NMOS transistors, and assumed to be n-type in PMOS transistors. LDD ion implanted regions are assumed to be n-type in NMOS transistors, and assumed to be p-type in PMOS transistors. S/D ion implanted regions are assumed to be n-type in NMOS transistors, and are assumed to be p-type in PMOS transistors.

Figure 1B:
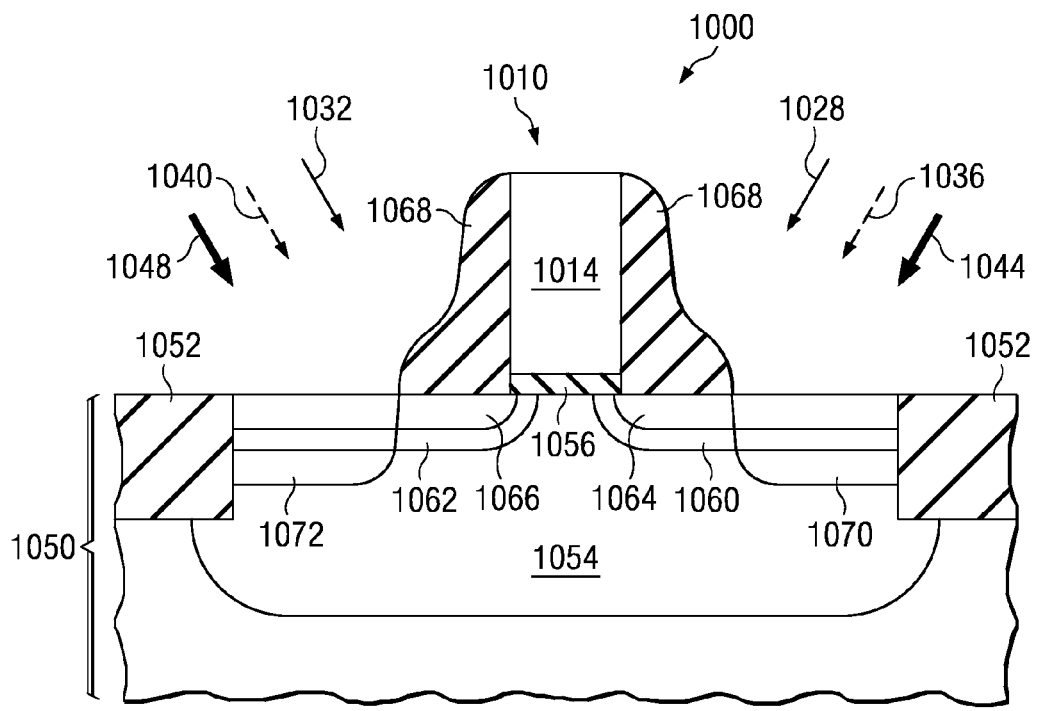
Figure 1C:
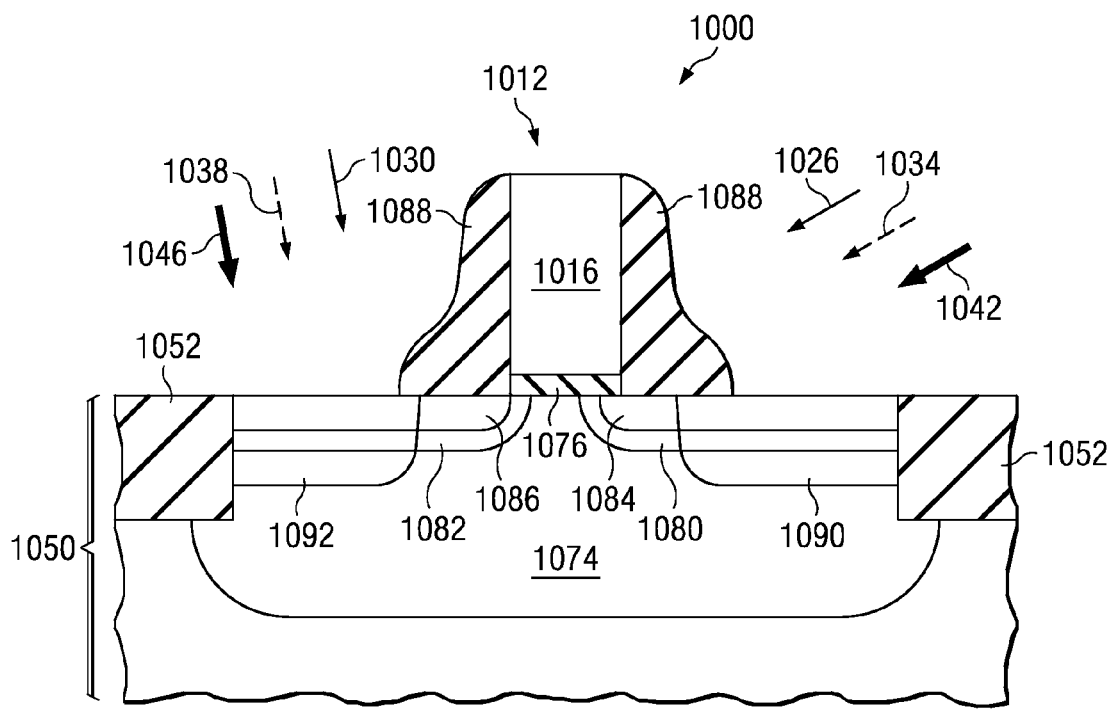

FIG. 1A through FIG. 1C depict an integrated circuit having a symmetric MOS transistor and an asymmetric MOS transistor formed according to an embodiment of the instant invention. Referring to FIG. 1A, the integrated circuit (1000) has an upper edge (1002), a right edge (1004), a lower edge (1006) and a left edge (1008). The integrated circuit has a symmetric MOS transistor (1010) and an asymmetric MOS transistor (1012). The symmetric MOS transistor (1010) has a first gate (1014) with an upper-lower longitudinal axis. The asymmetric MOS transistor (1012) has a second gate (1016) with a left-right longitudinal axis. Offset and sidewall spacers commonly formed on lateral surfaces of MOS gates are not shown in FIG. 1A for clarity. The symmetric MOS transistor (1010) has a first source area (1018) adjacent to the first gate (1014), and a first drain area (1020) adjacent to the first gate (1014) opposite the first source area (1018). The asymmetric MOS transistor (1012) has a second source area (1022) adjacent to the second gate (1016), and a second drain area (1024) adjacent to the second gate (1016) opposite the second source area (1022). Other components in the integrated circuit (1000) are not shown in FIG. 1A for clarity.

The symmetric MOS transistor (1010) and the asymmetric MOS transistor (1012) are formed using halo, LDD and S/D ion implant processes which produce halo, LDD and S/D ion implanted layers at a top surface of the integrated circuit (1000). In the instant embodiment, the symmetric MOS transistor (1010) and the asymmetric MOS transistor (1012) are formed using angled halo sub-implants, depicted in FIG. 1A as a first halo sub-implant (1026) angled toward the upper direction, a second halo sub-implant (1028) angled toward the right direction, a third halo sub-implant (1030) angled toward the lower direction, and a fourth halo sub-implant (1032) angled toward the left direction. In one embodiment, at least one of a tilt angle, dose, energy or dopant species may be different between the first halo sub-implant (1026) and the third halo sub-implant (1030). The tilt angles, doses, energies and dopant species of the second halo sub-implant (1028) and the fourth halo sub-implant (1032) are substantially equal. One, two or three of the halo sub-implants (1026, 1028, 1030, 1032) may be omitted during formation of the symmetric MOS transistor (1010) and the asymmetric MOS transistor (1012), consistent with providing symmetric halo sub-implants to the symmetric MOS transistor (1010). For illustrative purposes, the first halo sub-implant (1026) is depicted in FIG. 1A as having a larger tilt angle from a perpendicular axis to the top surface of the integrated circuit (1000) than the third halo sub-implant (1030).

The symmetric MOS transistor (1010) and the asymmetric MOS transistor (1012) are formed using angled LDD sub-implants, depicted in FIG. 1A as a first LDD sub-implant (1034) angled toward the upper direction, a second LDD sub-implant (1036) angled toward the right direction, a third LDD sub-implant (1038) angled toward the lower direction, and a fourth LDD sub-implant (1040) angled toward the left direction. In one embodiment, at least one of a tilt angle, dose, energy or dopant species may be different between the first LDD sub-implant (1034) and the third LDD sub-implant (1038). The tilt angles, doses, energies and dopant species of the second LDD sub-implant (1036) and the fourth LDD sub-implant (1040) are substantially equal. One, two or three of the LDD sub-implants (1034, 1036, 1038, 1040) may be omitted during formation of the symmetric MOS transistor (1010) and the asymmetric MOS transistor (1012) consistent with providing symmetric LDD sub-implants to the symmetric MOS transistor (1010). For illustrative purposes, the first LDD sub-implant (1034) is depicted as having a higher tilt angle from the perpendicular axis than the third LDD sub-implant (1038).

The symmetric MOS transistor (1010) and the asymmetric MOS transistor (1012) may be formed using angled S/D sub-implants, depicted in FIG. 1A as a first S/D sub-implant (1042) angled toward the upper direction, a second S/D sub-implant (1044) angled toward the right direction, a third S/D sub-implant (1046) angled toward the lower direction, and a fourth S/D sub-implant (1048) angled toward the left direction. In one embodiment, at least one of a tilt angle, dose, energy or dopant species may be different between the first S/D sub-implant (1042) and the third S/D sub-implant (1046). One, two or even three of the S/D sub-implants (1042, 1044, 1046, 1048) may be omitted during formation of the symmetric MOS transistor (1010) and the asymmetric MOS transistor (1012). For illustrative purposes, the first S/D sub-implant (1042) is depicted as having a higher tilt angle from the perpendicular axis than the third S/D sub-implant (1046).

FIG. 1B and FIG. 1C are cross-sections of the integrated circuit (1000), through the symmetric MOS transistor (1010) and the asymmetric MOS transistor (1012) depicted in FIG. 1A. FIG. 1B depicts a cross-section at section line A-A of FIG. 1A. FIG. 1C depicts a cross-section at section line B-B of FIG. 1A. Referring to FIG. 1B, the symmetric MOS transistor (1010) is formed on the substrate (1050) of the integrated circuit (1000), which is commonly a single crystal silicon wafer, but may be a silicon-on-insulator (SOI) wafer, a hybrid orientation technology (HOT) wafer with regions of different crystal orientations, or other material appropriate for fabrication of the integrated circuit (1000). Elements of field oxide (1052) may be formed at a top surface of the substrate (1050), typically of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). A first well (1054) may be formed in the substrate (1050), typically by ion implanting a set of dopants at doses between $1 \cdot 10^{11}$ to $1 \cdot 10^{14}$ atoms/cm$^2$, into a region defined for the symmetric MOS transistor (1010). The symmetric MOS transistor (1010) has a first gate dielectric layer (1056), formed on a top surface of the substrate (1050). The first gate dielectric layer (1056) is typically silicon dioxide, nitrogen doped silicon dioxide, silicon oxy-nitride, hafnium oxide, layers of silicon dioxide and silicon nitride, or other insulating material, and commonly between 1 and 5 nanometers thick. The first gate dielectric layer (1056) is typically formed using any of a variety of gate dielectric formation process, for example thermal oxidation, plasma nitridation of an oxide layer, and/or dielectric material deposition by atomic layer deposition (ALD) processes. The first gate (1014) is formed on a top surface of the first gate dielectric layer (1056), typically of polycrystalline silicon, commonly known as polysilicon, between 50 and 150 nanometers thick. A lateral length of the first gate (1014), in the direction of charged carrier flow, is selected to provide a desired on-state current density of the symmetric MOS transistor (1010).

A first drain side halo implanted region (1060) and a first source side halo implanted region (1062) are formed by the first halo sub-implant, not shown in FIG. 1B for clarity, the second halo sub-implant (1028), the third halo sub-implant, not shown in FIG. 1B for clarity, and the fourth halo sub-implant (1032). Spatial distributions of halo dopants in the first drain side halo implanted region (1060) and the first source side halo implanted region (1062) are established by the angles, doses and energies of the halo sub-implants. Because the first and third halo sub-implants are symmetric with respect to the upper-lower longitudinal axis of the first gate (1014), and because the second halo sub-implant (1028) and the fourth halo sub-implant (1032) have substantially equal angles, doses and energies, the first drain side halo implanted region (1060) and the first source side halo implanted region (1062) are substantially symmetric with respect to the first gate (1014). A drain side lateral overlap of the first drain side halo implanted region (1060) with the first gate (1014) is substantially equal to a source side lateral overlap of the first source side halo implanted region (1062) with the first gate (1014).

A first drain side LDD implanted region (1064) and a first source side LDD implanted region (1066) are formed by the first LDD sub-implant, not shown in FIG. 1B for clarity, the second LDD sub-implant (1036), the third LDD sub-implant, not shown in FIG. 1B for clarity, and the fourth LDD sub-implant (1040). Spatial distributions of LDD dopants in the first drain side LDD implanted region (1064) and the first source side LDD implanted region (1066) are established by the angles, doses and energies of the LDD sub-implants. Because the first and third LDD sub-implants are symmetric with respect to the upper-lower longitudinal axis of the first gate (1014), and because the second LDD sub-implant (1036) and the fourth LDD sub-implant (1040) have substantially equal angles, doses and energies, the first drain side LDD implanted region (1064) and the first source side LDD implanted region (1066) are substantially symmetric with respect to the first gate (1014). A drain side lateral overlap of the first drain side LDD implanted region (1064) with the first gate (1014) is substantially equal to a source side lateral overlap of the first source side LDD implanted region (1066) with the first gate (1014).

For illustrative purposes, a depth of the first drain side LDD implanted region (1064) and the first source side LDD implanted region (1066) are depicted as less than a depth of the first drain side halo implanted region (1060) and the first source side halo implanted region (1062). It is within the scope of the instant invention to form MOS transistors with upper-lower gate longitudinal axes having different lateral overlaps of halo implanted regions and LDD implanted regions with MOS gates and different depths of halo implanted regions and LDD implanted regions, by adjusting tilt angles, doses, energies, and species of halo sub-implants and LDD sub implants.

Gate sidewall spacers are typically formed on lateral surfaces of MOS gates between ion implantation of LDD regions and ion implantation of S/D regions. Gate sidewall spacers are commonly formed by deposition of one or more conformal layers of silicon nitride and/or silicon dioxide, commonly between 50 and 200 nanometers thick, on a top and lateral surfaces of an MOS gate and a top surface of a surrounding substrate, followed by removal of the conformal layer material from the top surface of the MOS gate and the top surface of the substrate by known anisotropic etching methods, leaving the conformal layer material on the lateral surfaces of the MOS gate. In the embodiment depicted in FIG. 1B, a first gate sidewall spacer (1068) is formed on lateral surfaces of the first gate (1014).

A first drain side S/D implanted region (1070) and a first source side S/D implanted region (1072) are formed by the first S/D sub-implant, not shown in FIG. 1B for clarity, the second S/D sub-implant (1044), the third S/D sub-implant, not shown in FIG. 1B for clarity, and the fourth S/D sub-implant (1048). Spatial distributions of S/D dopants in the first drain side S/D implanted region (1070) and the first source side S/D implanted region (1072) are established by the angles, doses and energies of the S/D Because the first and third S/D sub-implants are symmetric with respect to the upper-lower longitudinal axis of the first gate (1014), and because the second S/D sub-implant (1044) and the fourth S/D sub-implant (1048) have substantially equal angles, doses and energies, the first drain side S/D implanted region (1070) and the first source side S/D implanted region (1072) are substantially symmetric with respect to the first gate (1014). A drain side lateral overlap of the first drain side S/D implanted region (1070) with the first gate (1014) is substantially equal to a source side lateral overlap of the first source side S/D implanted region (1072) with the first gate (1014).

Referring to FIG. 1C, the asymmetric MOS transistor (1012) is formed on the substrate (1050) as described in reference to FIG. 1B. Elements of field oxide (1052) are formed at a top surface of the substrate (1050), as described in reference to FIG. 1B. A second well (1074) may be formed in the substrate (1050), as described in reference to FIG. 1B, in a region defined for the asymmetric MOS transistor (1012). The asymmetric MOS transistor (1012) has a second gate dielectric layer (1076), formed on a top surface of the substrate (1050), as described in reference to FIG. 1B and possibly concurrently with the first gate dielectric layer (1056). The second gate (1016) is formed on a top surface of the second gate dielectric layer (1076), as described in reference to FIG. 1B and possibly concurrently with the first gate (1014).

A second drain side halo implanted region (1080) and a second source side halo implanted region (1082) are formed by the first halo sub-implant (1026), the second halo sub-implant, not shown in FIG. 1C for clarity, the third halo sub-implant (1030), and the fourth halo sub-implant, not shown in FIG. 1C for clarity. Spatial distributions of halo dopants in the second drain side halo implanted region (1080) and the second source side halo implanted region (1082) are established by the angles, doses and energies of the halo sub-implants. Because the first halo sub-implant (1026) may have a different tilt angle, dose, energy or dopant species than the third halo sub-implant (1030), a drain side lateral overlap between the second gate (1016) and the second drain side halo implanted region (1080) may be different than a source side lateral overlap with the second source side halo implanted region (1082). The difference in halo overlaps may provide an advantageous electrical performance of the asymmetric MOS transistor (1012).

For illustrative purposes, the first halo sub-implant (1026) is depicted in FIG. 1C as having a larger tilt angle from the perpendicular axis than the third halo sub-implant (1030), and correspondingly, the second drain side halo implanted region (1080) is depicted as having a larger overlap with the second gate (1016) than the second source side halo implanted region (1082). In other embodiments, overlaps between the second drain side halo implanted region (1080) and the second gate (1016), and between the second source side halo implanted region (1082) and the second gate (1016) may be varied to provide desired transistor properties such as capacitance between gate and drain, on-state current, off-state leakage, and threshold potential.

A second drain side LDD implanted region (1084) and a second source side LDD implanted region (1086) are formed by the first LDD sub-implant (1034), the second LDD sub-implant, not shown in FIG. 1C for clarity, the third LDD sub-implant (1038), and the fourth LDD sub-implant, not shown in FIG. 1C for clarity. Spatial distributions of LDD dopants in the second drain side LDD implanted region (1084) and the second source side LDD implanted region (1086) are established by the angles, doses and energies of the LDD sub-implants. Because the first LDD sub-implant (1034) may have a different tilt angle, dose, energy or dopant species than the third LDD sub-implant (1038), a drain side lateral overlap between the second gate (1016) and the second drain side LDD implanted region (1084) may be different than a source side lateral overlap with the second source side LDD implanted region (1086). The difference in LDD overlaps may provide an advantageous electrical performance of the asymmetric MOS transistor (1012).

For illustrative purposes, the first LDD sub-implant (1034) is depicted in FIG. 1C as having a larger tilt angle from the perpendicular axis than the third LDD sub-implant (1038), and correspondingly, the second drain side LDD implanted region (1084) is depicted as having a larger overlap with the second gate (1016) than the second source side LDD implanted region (1086). In other embodiments, overlaps between the second drain side LDD implanted region (1084)

and the second gate (1016), and between the second source side LDD implanted region (1086) and the second gate (1016) may be varied to provide desired transistor properties such as capacitance between gate and drain, on-state current, off-state leakage, and threshold potential.

For illustrative purposes, the first halo sub-implant (1026) and the third halo sub-implant (1030) are depicted in FIG. 1C as having a larger tilt angle from the perpendicular axis than the first LDD sub-implant (1034) and the third LDD sub-implant (1038), resulting in the second drain side halo implanted region (1080) and the second source side halo implanted region (1082) having larger lateral overlaps with the second gate (1016) than the second drain side LDD implanted region (1084) and the second source side LDD implanted region (1086). A depth of the second drain side LDD implanted region (1084) and the second source side LDD implanted region (1086) are depicted as greater than a depth of the second drain side halo implanted region (1080) and the second source side halo implanted region (1082). It is within the scope of the instant invention to form MOS transistors with left-right gate longitudinal axes having different lateral overlaps of halo implanted regions and LDD implanted regions with MOS gates and different depths of halo implanted regions and LDD implanted regions, by adjusting tilt angles, doses, energies, and species of halo sub-implants and LDD sub implants.

In the embodiment depicted in FIG. 1C, a second gate sidewall spacer (1088) is formed on lateral surfaces of the second gate (1016), as described in reference to FIG. 1B. A second drain side S/D implanted region (1090) and a second source side S/D implanted region (1092) are formed by the first S/D sub-implant (1042), the second S/D sub-implant, not shown in FIG. 1C for clarity, the third S/D sub-implant (1046), and the fourth S/D sub-implant, not shown in FIG. 1C for clarity. Spatial distributions of S/D dopants in the second drain side S/D implanted region (1090) and the second source side S/D implanted region (1092) are established by the angles, doses and energies of the S/D sub-implants. Because the first S/D sub-implant (1042) may have a different tilt angle, dose, energy or dopant species than the third S/D sub-implant (1046), a drain side lateral overlap between the second gate (1016) and the second drain side S/D implanted region (1090) may be different than a source side lateral overlap with the second source side S/D implanted region (1092). The difference in S/D overlaps may provide an advantageous electrical performance of the asymmetric MOS transistor (1012).

For illustrative purposes, the first S/D sub-implant (1042) is depicted in FIG. 1C as having a larger tilt angle from the perpendicular axis than the third S/D sub-implant (1046), and correspondingly, the second drain side S/D implanted region (1090) is depicted as having a larger overlap with the second gate (1016) than the second source side S/D implanted region (1092). In other embodiments, overlaps between the second drain side S/D implanted region (1090) and the second gate (1016), and between the second source side S/D implanted region (1092) and the second gate (1016) may be varied to provide desired transistor properties such as capacitance between gate and drain, on-state current, off-state leakage, and threshold potential.

It will be recognized by those familiar with integrated circuit fabrication that the advantages of the embodiment discussed in reference to FIG. 1A through FIG. 1C may be realized by similar embodiments in which relative positions of drain and source areas are exchanged, with appropriate changes to angled sub-implants.

Figure 2A:
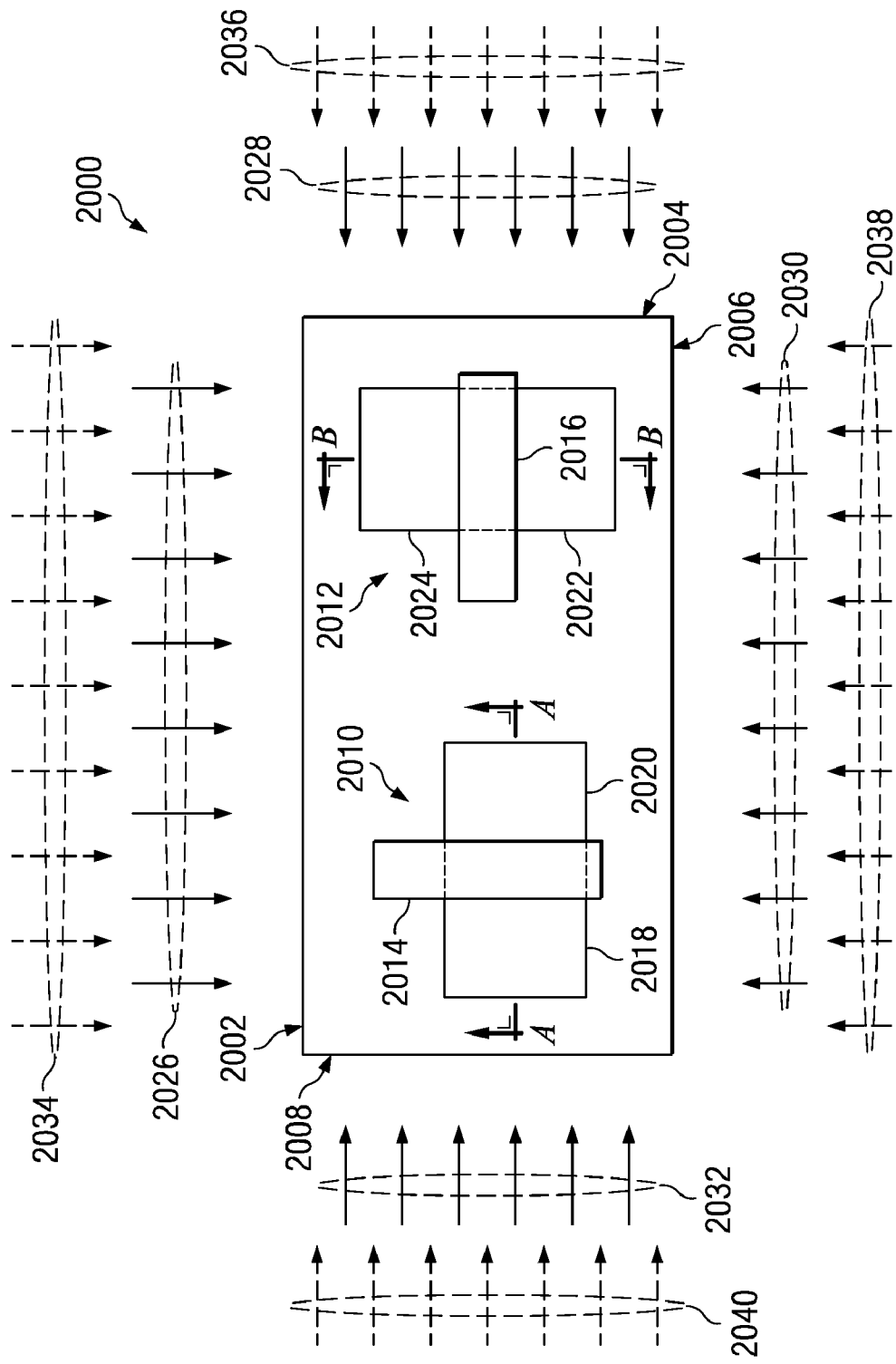
FIG. 2A through FIG. 2C depict an integrated circuit having a symmetric transistor and an asymmetric transistor formed according to a first specific embodiment of the instant invention.
Figure 2B:
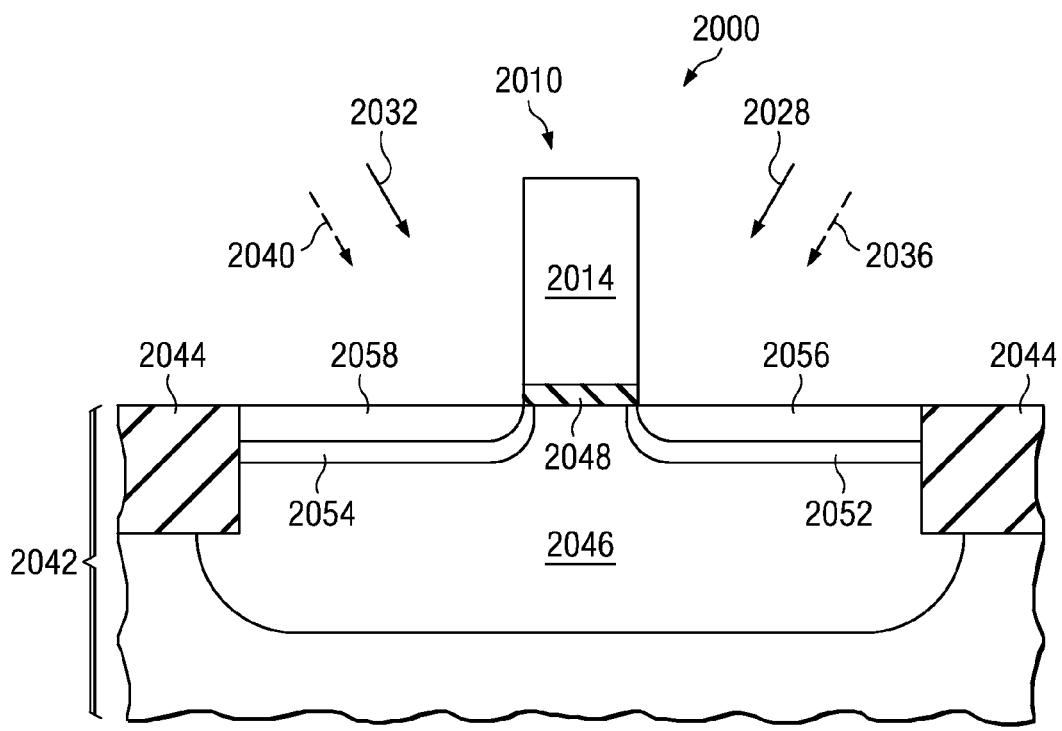
Figure 2C:
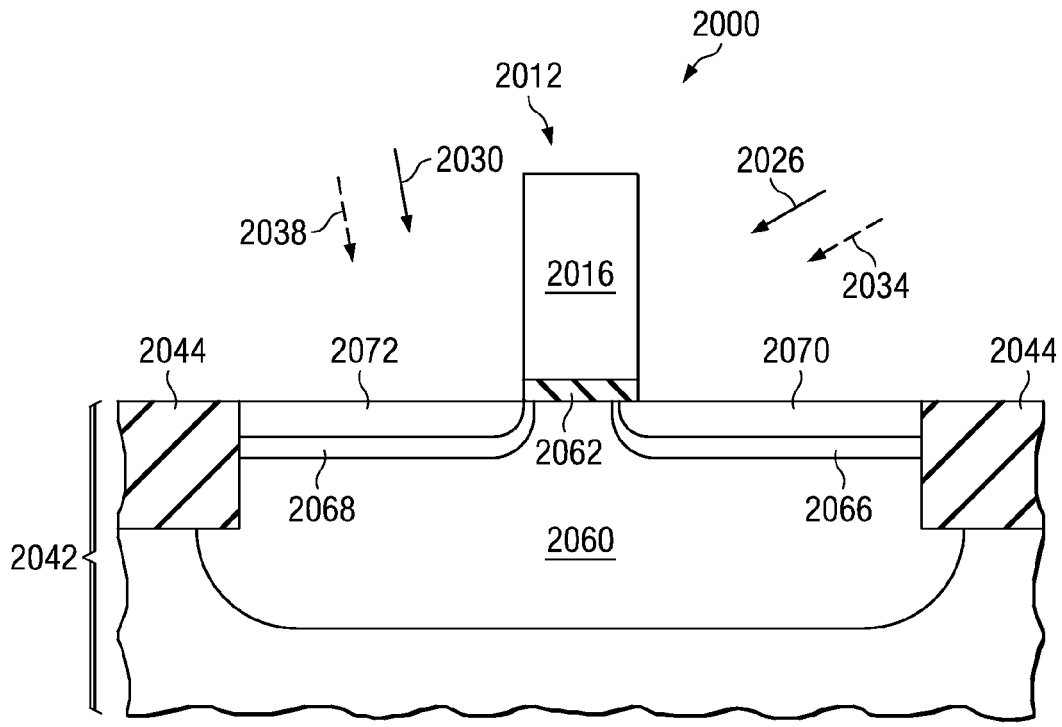

FIG. 2A through FIG. 2C depict an integrated circuit having a symmetric transistor and an asymmetric transistor formed according to a first specific embodiment of the instant invention. FIG. 2A is a top view of the integrated circuit (2000) with an upper edge (2002), a right edge (2004), a lower edge (2006) and a left edge (2008). The integrated circuit has a symmetric transistor (2010) and an asymmetric transistor (2012). The symmetric transistor (2010) has a first gate (2014) with an upper-lower longitudinal axis. The asymmetric transistor (2012) has a second gate (2016) with a left-right longitudinal axis. The symmetric transistor (2010) has a first source area (2018) adjacent to, and on a left side of, the first gate (2014), and a first drain area (2020) adjacent to the first gate (2014) opposite the first source area (2018). The asymmetric transistor (2012) has a second source area (2022) adjacent to, and on a lower side of, the second gate (2016), and a second drain area (2024) adjacent to the second gate (2016) opposite the second source area (2022). Other components in the integrated circuit (2000) are not shown in FIG. 2A for clarity.

The symmetric transistor (2010) and the asymmetric transistor (2012) are formed using halo and LDD ion implant processes which include angled sub-implants to produce halo and LDD ion implanted layers at a top surface of the integrated circuit (2000). The halo ion implant process has a first halo sub-implant (2026) angled toward the upper direction, a second halo sub-implant (2028) angled toward the right direction, a third halo sub-implant (2030) angled toward the lower direction, and a fourth halo sub-implant (2032) angled toward the left direction. A tilt angle of the first halo sub-implant (2026) from an axis perpendicular to the top surface of the integrated circuit (2000) is greater than a tilt angle of the third halo sub-implant (2030) from the perpendicular axis. An energy and/or a dose of the first halo sub-implant (2026) may be greater than an energy and/or dose of the third halo sub-implant (2030). A tilt angle of the second halo sub-implant (2028) is substantially equal to a tilt angle of the fourth halo sub-implant (2032) from the perpendicular axis. An energy and dose of the second halo sub-implant (2028) are substantially equal to an energy and dose of the fourth halo sub-implant (2032).

Similarly, the LDD ion implant process has a first LDD sub-implant (2034) angled toward the upper direction, a second LDD sub-implant (2036) angled toward the right direction, a third LDD sub-implant (2038) angled toward the lower direction, and a fourth LDD sub-implant (2040) angled toward the left direction. A tilt angle of the first LDD sub-implant (2034) is greater than a tilt angle of the third LDD sub-implant (2038) from the perpendicular axis. An energy and/or a dose of the first LDD sub-implant (2034) may be greater than an energy and/or dose of the third LDD sub-implant (2038). A tilt angle of the second LDD sub-implant (2036) is substantially equal to a tilt angle of the fourth LDD sub-implant (2040) from the perpendicular axis. An energy and dose of the second LDD sub-implant (2036) are substantially equal to an energy and dose of the fourth LDD sub-implant (2040).

FIG. 2B and FIG. 2C are cross-sections of the integrated circuit (2000), through the symmetric transistor (2010) and the asymmetric transistor (2012) depicted in FIG. 2A. FIG. 2B depicts a cross-section at section line A-A of FIG. 2A. FIG. 2C depicts a cross-section at section line B-B of FIG. 2A. Referring to FIG. 2B, the symmetric transistor (2010) is formed on a substrate (2042) of the integrated circuit (2000), as described in reference to FIG. 1A. Elements of field oxide (2044) are formed at a top surface of the substrate (2042), as described in reference to FIG. 1A. A first well (2046) may be formed in the substrate (2042), as described in reference to FIG. 1A. The symmetric transistor (2010) has a first gate dielectric layer (2048), formed on a top surface of the substrate (2042) as described in reference to FIG. 1A. A first gate (2014) is formed on a top surface of the first gate dielectric layer (2048), as described in reference to FIG. 1A.

A first drain side halo implanted region (2052) and a first source side halo implanted region (2054) are formed by the first halo sub-implant, not shown in FIG. 2B for clarity, the second halo sub-implant (2028), the third halo sub-implant, not shown in FIG. 2B for clarity, and the fourth halo sub-implant (2032). Spatial distributions of halo dopants in the first drain side halo implanted region (2052) and the first source side halo implanted region (2054) are established by the angles, doses and energies of the halo sub-implants. Because the first and third halo sub-implants are symmetric with respect to the upper-lower longitudinal axis of the first gate (2014), and because the second halo sub-implant (2028) and the fourth halo sub-implant (2032) have substantially equal angles, doses and energies, the first drain side halo implanted region (2052) and the first source side halo implanted region (2054) are substantially symmetric with respect to the first gate (2014). A drain side lateral overlap of the first drain side halo implanted region (2052) with the first gate (2014) is substantially equal to a source side lateral overlap of the first source side halo implanted region (2054) with the first gate (2014).

A first drain side LDD implanted region (2056) and a first source side LDD implanted region (2058) are formed by the first LDD sub-implant, not shown in FIG. 2B for clarity, the second LDD sub-implant (2036), the third LDD sub-implant, not shown in FIG. 2B for clarity, and the fourth LDD sub-implant (2040). Spatial distributions of LDD dopants in the first drain side LDD implanted region (2056) and the first source side LDD implanted region (2058) are established by the angles, doses and energies of the LDD sub-implants. Because the first and third LDD sub-implants are symmetric with respect to the upper-lower longitudinal axis of the first gate (2014), and because the second LDD sub-implant (2036) and the fourth LDD sub-implant (2040) have substantially equal angles, doses and energies, the first drain side LDD implanted region (2056) and the first source side LDD implanted region (2058) are substantially symmetric with respect to the first gate (2014). A drain side lateral overlap of the first drain side LDD implanted region (2056) with the first gate (2014) is substantially equal to a source side lateral overlap of the first source side LDD implanted region (2058) with the first gate (2014).

For illustrative purposes, the second halo sub-implant (2028) and the fourth halo sub-implant (2032) are depicted in FIG. 2B as having a larger tilt angle from the perpendicular axis than the second LDD sub-implant (2036) and the fourth LDD sub-implant (2040), resulting in the first drain side halo implanted region (2052) and the first source side halo implanted region (2058) having larger lateral overlaps with the first gate (2014) than the first drain side LDD implanted region (2056) and the first source side LDD implanted region (2056). A depth of the first drain side LDD implanted region (2056) and the first source side LDD implanted region (2058) are depicted as shallower than the first drain side halo implanted region (2052) and the first source side halo implanted region (2054). It is within the scope of the instant invention to form symmetric transistors with upper-lower gate longitudinal axes having different lateral overlaps of halo implanted regions and LDD implanted regions and different relative depths of halo implanted regions and LDD implanted regions, by adjusting tilt angles, doses, energies, and species of halo sub-implants and LDD sub implants.

Referring to FIG. 2C, the asymmetric transistor (2012) is formed on the substrate (2042) of the integrated circuit (2000), as described in reference to FIG. 1A. Elements of field oxide (2044) are formed at a top surface of the substrate (2042), as described in reference to FIG. 1A. A second well (2060) may be formed in the substrate (2042), as described in reference to FIG. 1A. The asymmetric transistor (2012) has a second gate dielectric layer (2062), formed on a top surface of the substrate (2042) as described in reference to FIG. 1A. A second gate (2016) is formed on a top surface of the second gate dielectric layer (2062), as described in reference to FIG. 1A.

A second drain side halo implanted region (2066) and a second source side halo implanted region (2068) are formed by the first halo sub-implant (2026), the second halo sub-implant, not shown in FIG. 2C for clarity, the third halo sub-implant (2030), and the fourth halo sub-implant, not shown in FIG. 2C for clarity. Spatial distributions of halo dopants in the second drain side halo implanted region (2066) and the second source side halo implanted region (2068) are established by the angles, doses and energies of the halo sub-implants. Because the first halo sub-implant (2026) has a greater tilt angle than the third halo sub-implant (2030) and possibly has a greater energy and/or dose than the third halo sub-implant (2030), a drain side lateral overlap between the second gate (2016) and the second drain side halo implanted region (2066) is larger than a source side lateral overlap with the second source side halo implanted region (2068).

A second drain side LDD implanted region (2070) and a second source side LDD implanted region (2072) are formed by the first LDD sub-implant (2034), the second LDD sub-implant, not shown in FIG. 2C for clarity, the third LDD sub-implant (2038) and the fourth LDD sub-implant, not shown in FIG. 2C for clarity. Spatial distributions of LDD dopants in the second drain side LDD implanted region (2070) and the second source side LDD implanted region (2072) are established by the angles, doses and energies of the LDD sub-implants. Because the first LDD sub-implant (2034) has a greater tilt angle than the third LDD sub-implant (2038) and possibly has a greater energy and/or dose than the third LDD sub-implant (2038), a drain side lateral overlap between the second gate (2016) and the second drain side LDD implanted region (2070) is larger than a source side lateral overlap with the second source side LDD implanted region (2072).

Performing the halo implant process and the LDD implant process such that gate overlaps of the second drain side halo and LDD implanted regions (2066, 2070) are larger than gate overlaps of the second source side halo and LDD implanted regions (2068, 2072) may advantageously improve a relationship between an on-state current density and an off-state leakage current density of the asymmetric transistor (2012). A depth of the second drain side LDD implanted region (2070) and the second source side LDD implanted region (2072) are depicted as greater than a depth of the second drain side halo implanted region (2066) and the second source side halo implanted region (2068). It is within the scope of the instant invention to form asymmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants. It will be recognized by those familiar with integrated circuit fabrication that the advantages of the embodiment discussed in reference to FIG. 2A through FIG. 2C may be realized by similar embodiments in which relative positions of drain and source areas are exchanged, with appropriate changes to angled sub-implants. It will also be recognized by those familiar with integrated circuit fabrication that the advantages of the embodiment discussed in reference to FIG. 2A through FIG. 2C may be realized by similar embodiments in which relative orientations of the symmetric transistor (2010) and the asymmetric transistor (2012) are exchanged, with appropriate changes to angled sub-implants.

Figure 3A:
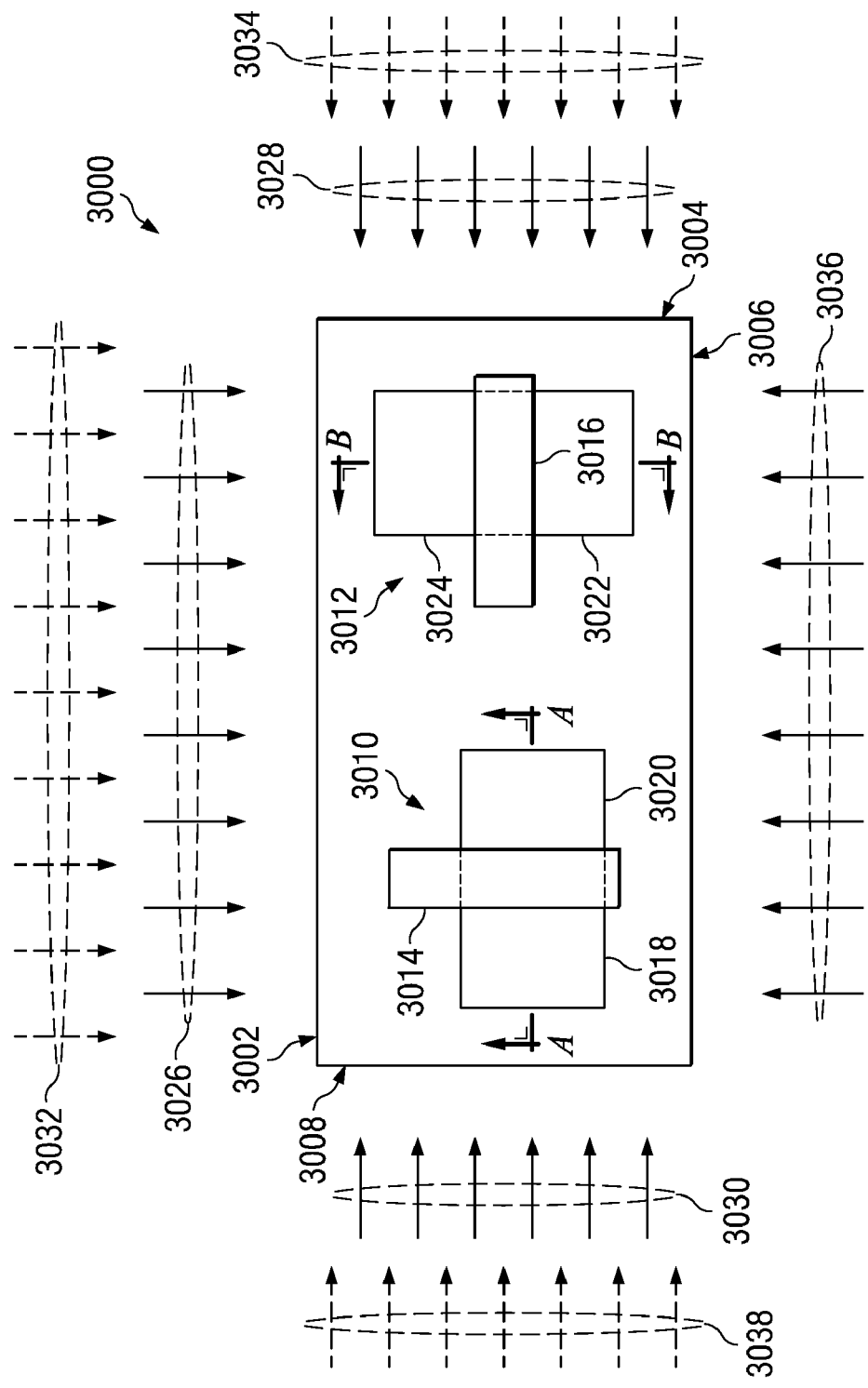
FIG. 3A through FIG. 3C depict an integrated circuit having a symmetric transistor and an asymmetric transistor formed according to a second specific embodiment of the instant invention.
Figure 3B:
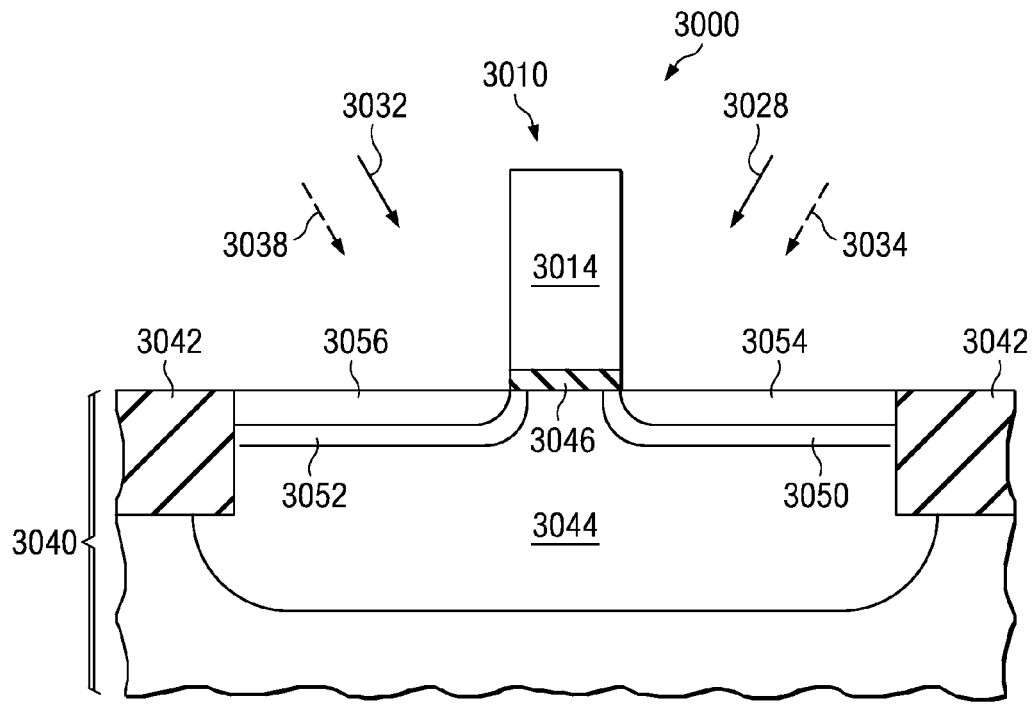
Figure 3C:
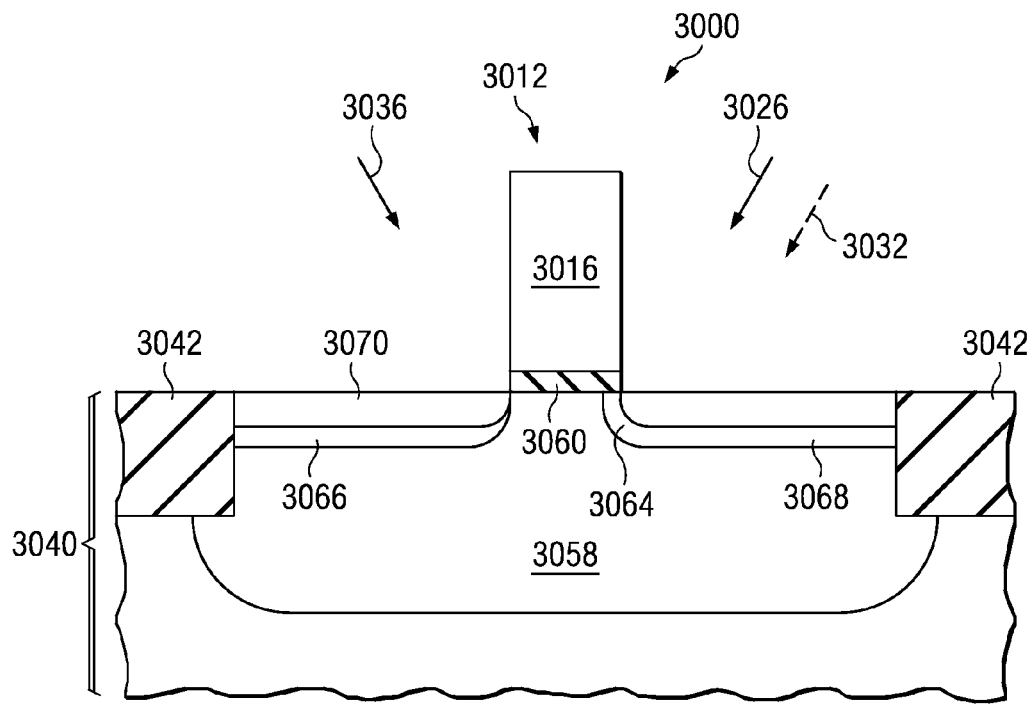

FIG. 3A through FIG. 3C depict an integrated circuit having a symmetric transistor and an asymmetric transistor formed according to a second specific embodiment of the instant invention. FIG. 3A is a top view of the integrated circuit (3000) with an upper edge (3002), a right edge (3004), a lower edge (3006) and a left edge (3008). The integrated circuit has a symmetric transistor (3010) and an asymmetric transistor (3012). The symmetric transistor (3010) has a first gate (3014) with an upper-lower longitudinal axis. The asymmetric transistor (3012) has a second gate (3016) with a left-right longitudinal axis. The symmetric transistor (3010) has a first source area (3018) adjacent to, and on a left side of, the first gate (3014), and a first drain area (3020) adjacent to the first gate (3014) opposite the first source area (3018). The asymmetric transistor (3012) has a second source area (3022) adjacent to, and on a lower side of, the second gate (3016), and a second drain area (3024) adjacent to the second gate (3016) opposite the second source area (3022). Other components in the integrated circuit (3000) are not shown in FIG. 3A for clarity.

The symmetric transistor (3010) and the asymmetric transistor (3012) are formed using halo and LDD ion implant processes which include angled sub-implants to produce halo and LDD ion implanted layers at a top surface of the integrated circuit (3000). The halo ion implant process has a first halo sub-implant (3026) angled toward the upper direction, a second halo sub-implant (3028) angled toward the right direction, and a third halo sub-implant (3030) angled toward the left direction. No halo sub-implant angled toward the lower direction is performed in the instant embodiment. A tilt angle of the second halo sub-implant (3028) is substantially equal to a tilt angle of the third halo sub-implant (3030) from the perpendicular axis. An energy and dose of the second halo sub-implant (3028) are substantially equal to an energy and dose of the third halo sub-implant (3030).

The LDD ion implant process has a first LDD sub-implant (3032) angled toward the upper direction, a second LDD sub-implant (3034) angled toward the right direction, a third LDD sub-implant (3036) angled toward the lower direction, and a fourth LDD sub-implant (3038) angled toward the left direction. A tilt angle of the first LDD sub-implant (3032) from the perpendicular axis is larger than a tilt angle of the third LDD sub-implant (3036) from the perpendicular axis. An energy and/or a dose of the first LDD sub-implant (3032) may be greater than an energy and/or a dose of the third LDD sub-implant (3036). A tilt angle of the second LDD sub-implant (3034) is substantially equal to a tilt angle of the fourth LDD sub-implant (3038) from the perpendicular axis. An energy and dose of the second LDD sub-implant (3034) are substantially equal to an energy and dose of the fourth LDD sub-implant (3038).

FIG. 3B and FIG. 3C are cross-sections of the integrated circuit (3000), through the symmetric transistor (3010) and the asymmetric transistor (3012) depicted in FIG. 3A. FIG. 3B depicts a cross-section at section line A-A of FIG. 3A. FIG. 3C depicts a cross-section at section line B-B of FIG. 3A. Referring to FIG. 3B, the symmetric transistor (3010) is formed on a substrate (3042) of the integrated circuit (3000), as described in reference to FIG. 1A. Elements of field oxide (3044) are formed at a top surface of the substrate (3042), as described in reference to FIG. 1A. A first well (3046) may be formed in the substrate (3042), as described in reference to FIG. 1A. The symmetric transistor (3010) has a first gate dielectric layer (3048), formed on a top surface of the substrate (3042) as described in reference to FIG. 1A. A first gate (3050) is formed on a top surface of the first gate dielectric layer (3048), as described in reference to FIG. 1A.

A first drain side halo implanted region (3052) and a first source side halo implanted region (3054) are formed by the first halo sub-implant, not shown in FIG. 3B for clarity, the second halo sub-implant (3028), and the third halo sub-implant (3030). Spatial distributions of halo dopants in the first drain side halo implanted region (3052) and the first source side halo implanted region (2054) are established by the angles, doses and energies of the halo sub-implants. Because the first halo sub-implant is symmetric with respect to the upper-lower longitudinal axis of the first gate (3014), and because the second halo sub-implant (3028) and the third halo sub-implant (3030) have substantially equal angles, doses and energies, the first drain side halo implanted region (3052) and the first source side halo implanted region (3054) are substantially symmetric with respect to the first gate (3014). A drain side lateral overlap of the first drain side halo implanted region (3052) with the first gate (3014) is substantially equal to a source side lateral overlap of the first source side halo implanted region (3054) with the first gate (3014).

A first drain side LDD implanted region (3054) and a first source side LDD implanted region (3056) are formed by the first LDD sub-implant, not shown in FIG. 3B for clarity, the second LDD sub-implant (3034), the third LDD sub-implant, not shown in FIG. 3B for clarity, and the fourth LDD sub-implant (3038). Spatial distributions of LDD dopants in the first drain side LDD implanted region (3054) and the first source side LDD implanted region (3056) are established by the angles, doses and energies of the LDD sub-implants. Because the first and third LDD sub-implants are symmetric with respect to the upper-lower longitudinal axis of the first gate (3014), and because the second LDD sub-implant (3034) and the fourth LDD sub-implant (3038) have substantially equal angles, doses and energies, the first drain side LDD implanted region (3054) and the first source side LDD implanted region (3056) are substantially symmetric with respect to the first gate (3014). A drain side lateral overlap of the first drain side LDD implanted region (3054) with the first gate (3014) is substantially equal to a source side lateral overlap of the first source side LDD implanted region (3056) with the first gate (3014).

For illustrative purposes, the second halo sub-implant (3028) and the third halo sub-implant (3030) are depicted in FIG. 3B as having a larger tilt angle from the perpendicular axis than the second LDD sub-implant (3034) and the fourth LDD sub-implant (3038), resulting in the first drain side halo implanted region (3052) and the first source side halo implanted region (3054) having larger lateral overlaps with the first gate (3014) than the first drain side LDD implanted region (3054) and the first source side LDD implanted region (3056). A depth of the first drain side LDD implanted region (3054) and the first source side LDD implanted region (3056) are depicted as less than a depth of the first drain side halo implanted region (3052) and the first source side halo implanted region (3054). It is within the scope of the instant invention to form symmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants.

Referring to FIG. 3C, the asymmetric transistor (3012) is formed on the substrate (3042) of the integrated circuit (3000), as described in reference to FIG. 1A. Elements of field oxide (3044) are formed at a top surface of the substrate (3042), as described in reference to FIG. 1A. A second well (3060) may be formed in the substrate (3042), as described in reference to FIG. 1A. The asymmetric transistor (3012) has a second gate dielectric layer (3062), formed on a top surface of the substrate (3042) as described in reference to FIG. 1A. The second gate (3016) is formed on a top surface of the second gate dielectric layer (3062), as described in reference to FIG. 1A.

A second drain side halo implanted region (3064) and a second source side halo implanted region (3066) are formed by the first halo sub-implant (3026), the second halo sub-implant, not shown in FIG. 3C for clarity, and the fourth halo sub-implant, also not shown in FIG. 3C for clarity. Spatial distributions of halo dopants in the second drain side halo implanted region (3064) and the second source side halo implanted region (3066) are established by the angles, doses and energies of the halo sub-implants. Because no halo sub-implant angled toward the lower direction is performed in the instant embodiment, a drain side lateral overlap between the second gate (3016) and the second drain side halo implanted region (3064) is larger than a source side lateral overlap with the second source side halo implanted region (3066).

A second drain side LDD implanted region (3068) and a second source side LDD implanted region (3070) are formed by the first LDD sub-implant (3032), the second LDD sub-implant, not shown in FIG. 3C for clarity, the third LDD sub-implant (3036) and the fourth LDD sub-implant, not shown in FIG. 3C for clarity. Spatial distributions of LDD dopants in the second drain side LDD implanted region (3068) and the second source side LDD implanted region (3070) are established by the angles, doses and energies of the LDD sub-implants. Because the first LDD sub-implant (3032) has a greater tilt angle than the third LDD sub-implant (3036) and possibly has a greater energy and/or dose than the third LDD sub-implant (3036), a drain side lateral overlap between the second gate (3016) and the second drain side LDD implanted region (3068) is larger than a source side lateral overlap with the second source side LDD implanted region (3070).

Performing the halo implant process and the LDD implant process such that gate overlaps of the second drain side halo and LDD implanted regions (3064, 3068) are larger than gate overlaps of the second source side halo and LDD implanted regions (3066, 3070) may advantageously improve a relationship between an on-state current density and an off-state leakage current density of the asymmetric transistor (3012). A depth of the second drain side LDD implanted region (3068) and the second source side LDD implanted region (3070) are depicted as greater than a depth of the second drain side halo implanted region (3064) and the second source side halo implanted region (3066). It is within the scope of the instant invention to form asymmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants. It will be recognized by those familiar with integrated circuit fabrication that the advantages of the embodiment discussed in reference to FIG. 3A through FIG. 3C may be realized by similar embodiments in which relative positions of drain and source areas are exchanged, with appropriate changes to angled sub-implants. It will also be recognized by those familiar with integrated circuit fabrication that the advantages of the embodiment discussed in reference to FIG. 3A through FIG. 3C may be realized by similar embodiments in which relative orientations of the symmetric transistor (3010) and the asymmetric transistor (3012) are exchanged, with appropriate changes to angled sub-implants.

Figure 4A:
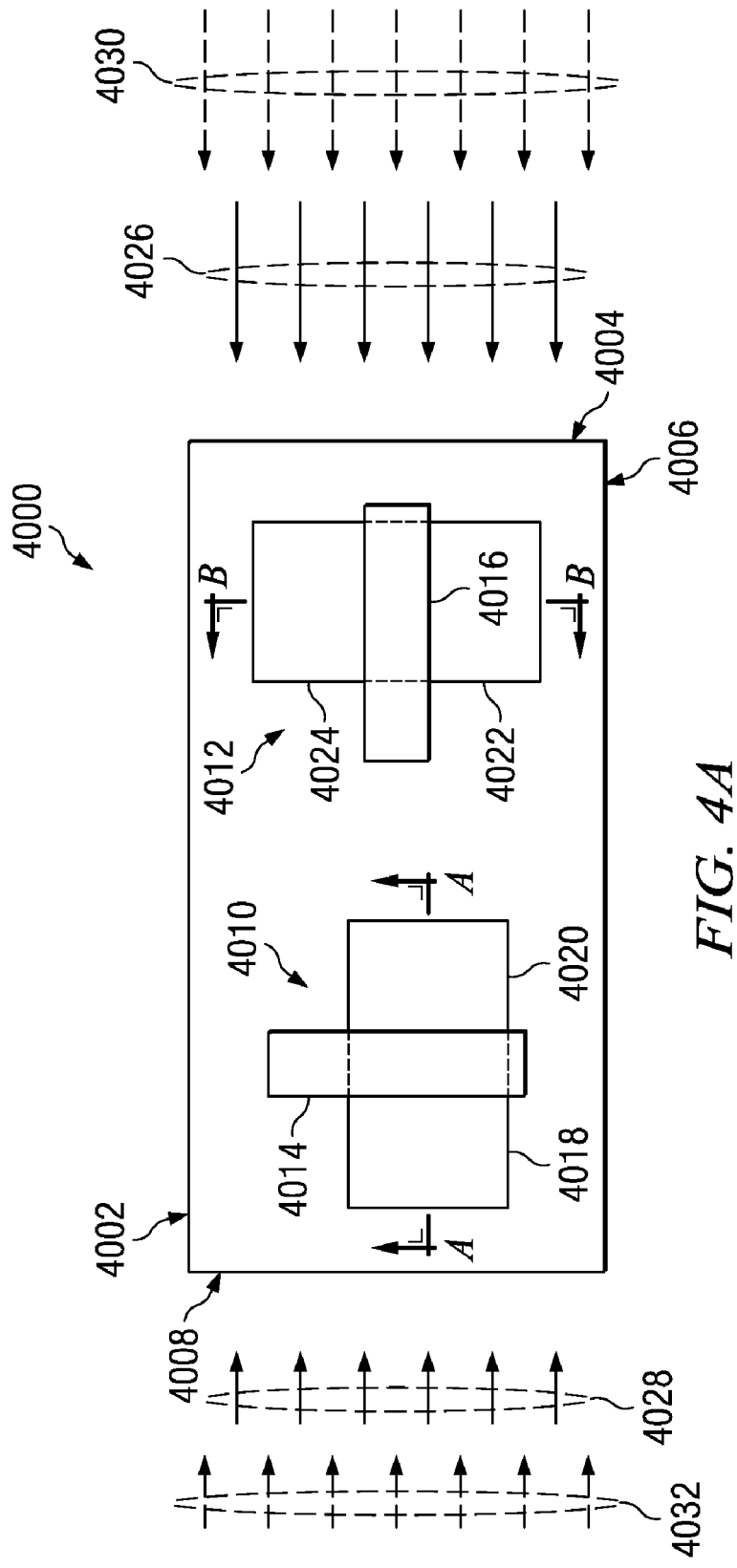
FIG. 4A through FIG. 4C depict an integrated circuit having a symmetric transistor and an asymmetric transistor formed according to a third specific embodiment of the instant invention.
Figure 4B:
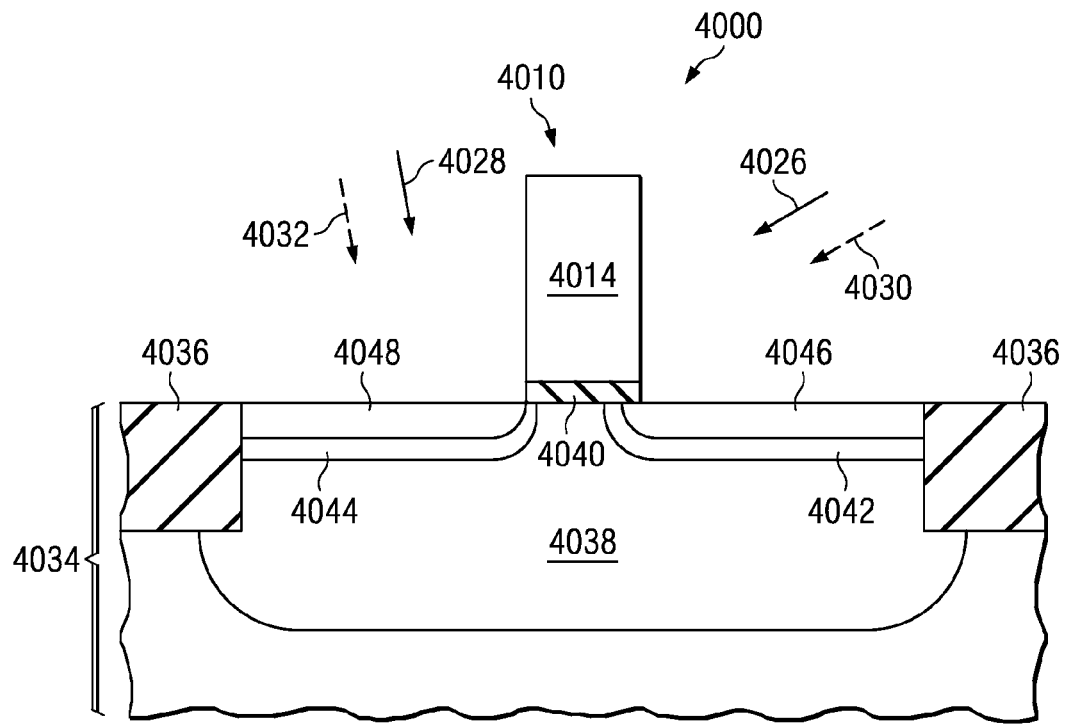
Figure 4C:
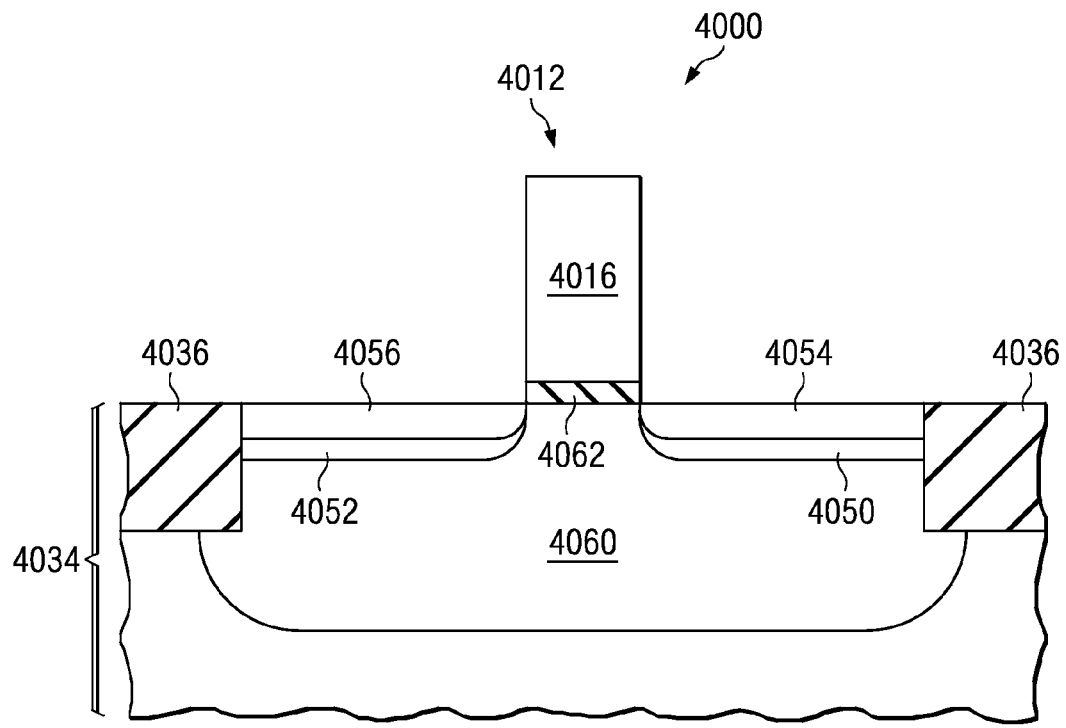

FIG. 4A through FIG. 4C depict an integrated circuit having a symmetric transistor and an asymmetric transistor formed according to a third specific embodiment of the instant invention. FIG. 4A is a top view of the integrated circuit (4000) with an upper edge (4002), a right edge (4004), a lower edge (4006) and a left edge (4008). The integrated circuit has an asymmetric transistor (4010) and a symmetric transistor (4012). The asymmetric transistor (4010) has a first gate (4014) with an upper-lower longitudinal axis. The symmetric transistor (4012) has a second gate (4016) with a left-right longitudinal axis. The asymmetric transistor (4010) has a first source area (4018) adjacent to, and on a left side of, the first gate (4014), and a first drain area (4020) adjacent to the first gate (4014) opposite the first source area (4018). The symmetric transistor (4012) has a second source area (4022) adjacent to, and on a lower side of, the second gate (4016), and a second drain area (4024) adjacent to the second gate (4016) opposite the second source area (4022). Other components in the integrated circuit (4000) are not shown in FIG. 4A for clarity.

The asymmetric transistor (4010) and the symmetric transistor (4012) are formed using halo and LDD ion implant processes which include angled sub-implants to produce halo and LDD ion implanted layers at a top surface of the integrated circuit (4000). The halo ion implant process has a first halo sub-implant (4026) angled toward the right direction, and a second halo sub-implant (4028) angled toward the left direction. No halo sub-implants angled toward the lower direction or the upper direction are performed in the instant embodiment. A tilt angle of the first halo sub-implant (4026) from the perpendicular axis is equal to or larger than a tilt angle of the second halo sub-implant (4028) from the perpendicular axis. An energy of the first halo sub-implant (4026) is equal to or greater than an energy of the second halo sub-implant (4028). A dose of the first halo sub-implant (4026) is greater than a dose of the second halo sub-implant (4028).

The LDD ion implant process has a first LDD sub-implant (4030) angled toward the right direction, and a second LDD sub-implant (4032) angled toward the left direction. No LDD sub-implants angled toward the lower direction or the upper direction are performed in the instant embodiment. A tilt angle of the first LDD sub-implant (4030) from the perpendicular axis is equal to or larger than a tilt angle of the second LDD sub-implant (4032) from the perpendicular axis. An energy of the first LDD sub-implant (4030) is equal to or greater than an energy of the second LDD sub-implant (4032). A dose of the first LDD sub-implant (4030) is greater than a dose of the second LDD sub-implant (4032).

FIG. 4B and FIG. 4C are cross-sections of the integrated circuit (4000), through the asymmetric transistor (4010) and the symmetric transistor (4012) depicted in FIG. 4A. FIG. 4B depicts a cross-section at section line A-A of FIG. 4A. FIG. 4C depicts a cross-section at section line B-B of FIG. 4A. Referring to FIG. 4B, the asymmetric transistor (4010) is formed on a substrate (4034) of the integrated circuit (4000), as described in reference to FIG. 1A. Elements of field oxide (4036) are formed at a top surface of the substrate (4034), as described in reference to FIG. 1A. A first well (4038) may be formed in the substrate (4034), as described in reference to FIG. 1A. The asymmetric transistor (4010) has a first gate dielectric layer (4040), formed on a top surface of the substrate (4034) as described in reference to FIG. 1A. The first gate (4014) is formed on a top surface of the first gate dielectric layer (4040), as described in reference to FIG. 1A.

A first drain side halo implanted region (4042) and a first source side halo implanted region (4044) are formed by the first halo sub-implant (4026) and the second halo sub-implant (4028). Spatial distributions of halo dopants in the first drain side halo implanted region (4042) and the first source side halo implanted region (4044) are established by the angles, doses and energies of the halo sub-implants. Because the first halo sub-implant (4026) has a greater dose than the second halo sub-implant (4028) and possibly has a greater energy and/or tilt angle than the second halo sub-implant (4028), a drain side lateral overlap between the first gate (4014) and the first drain side halo implanted region (4042) is larger than a lateral source side overlap with the first source side halo implanted region (4044).

A first drain side LDD implanted region (4046) and a first source side LDD implanted region (4048) are formed by the first LDD sub-implant (4030) and the second LDD sub-implant (4032). Spatial distributions of LDD dopants in the first drain side LDD implanted region (4046) and the first source side LDD implanted region (4048) are established by the angles, doses and energies of the LDD sub-implants. Because the first LDD sub-implant (4030) has a greater dose than the second LDD sub-implant (4032) and possibly has a greater energy and/or tilt angle than the second LDD sub-implant (4032), a drain side lateral overlap between the first gate (4014) and the first drain side LDD implanted region (4046) is larger than a lateral source side overlap with the first source side LDD implanted region (4048).

For illustrative purposes, the first halo sub-implant (4026) and the second halo sub-implant (4028) are depicted in FIG. 4B as having a larger tilt angle from the perpendicular axis than the first LDD sub-implant (4030) and the second LDD sub-implant (4032), respectively, resulting in the first drain side halo implanted region (4042) and the first source side halo implanted region (4044) having larger lateral overlaps with the first gate (4014) than the first drain side LDD implanted region (4046) and the first source side LDD implanted region (4048), respectively. A depth of the first drain side LDD implanted region (4046) and the first source side LDD implanted region (4048) are depicted as less than a depth of the first drain side halo implanted region (4042) and the first source side halo implanted region (4044). It is within the scope of the instant invention to form asymmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants.

Performing the halo implant process and the LDD implant process such that gate overlaps of the first drain side halo and LDD implanted regions (4042, 4046) are larger than gate overlaps of the first source side halo and LDD implanted regions (4044, 4048) may advantageously improve a relationship between an on-state current density and an off-state leakage current density of the asymmetric transistor (4010). A depth of the first drain side LDD implanted region (4046) and the first source side LDD implanted region (4048) are depicted as less than a depth of the first drain side halo implanted region (4042) and the first source side halo implanted region (4044). It is within the scope of the instant invention to form asymmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants.

Referring to FIG. 4C, the symmetric transistor (4012) is formed on the substrate (4034) of the integrated circuit (4000), as described in reference to FIG. 1A. Elements of field oxide (4036) are formed at a top surface of the substrate (4034), as described in reference to FIG. 1A. A second well (4074) may be formed in the substrate (4034), as described in reference to FIG. 1A. The symmetric transistor (4012) has a second gate dielectric layer (4062), formed on a top surface of the substrate (4034) as described in reference to FIG. 1A. The second gate (4016) is formed on a top surface of the second gate dielectric layer (4062), as described in reference to FIG. 1A.

A second drain side halo implanted region (4050) and a second source side halo implanted region (4052) are formed by the first halo sub-implant, not shown in FIG. 4C for clarity, and the second halo sub-implant, also not shown in FIG. 4C for clarity. Spatial distributions of halo dopants in the second drain side halo implanted region (4050) and the second source side halo implanted region (4052) are established by the angles, doses and energies of the halo sub-implants. Because the first and second halo sub-implants are symmetric with respect to the left-right longitudinal axis of the second gate (4016), the second drain side halo implanted region (4050) and the second source side halo implanted region (4052) are substantially symmetric with respect to the second gate (4016). A drain side lateral overlap of the second drain side halo implanted region (4050) with the second gate (4016) is substantially equal to a source side lateral overlap of the second source side halo implanted region (4052) with the second gate (4016).

A second drain side LDD implanted region (4054) and a second source side LDD implanted region (4056) are formed by the first LDD sub-implant (4030), not shown in FIG. 4C for clarity, and the second LDD sub-implant (4032), also not shown in FIG. 4C for clarity. Spatial distributions of LDD dopants in the second drain side LDD implanted region (4054) and the second source side LDD implanted region (4056) are established by the angles, doses and energies of the LDD sub-implants. Because the first and second LDD sub-implants are symmetric with respect to the left-right longitudinal axis of the second gate (4016), the second drain side LDD implanted region (4054) and the second source side LDD implanted region (4056) are substantially symmetric with respect to the second gate (4016). A drain side lateral overlap of the second drain side LDD implanted region (4054) with the second gate (4016) is substantially equal to a source side lateral overlap of the second source side LDD implanted region (4056) with the second gate (4016).

It will be recognized by those familiar with integrated circuit fabrication that the advantages of the embodiment discussed in reference to FIG. 4A through FIG. 4C may be realized by similar embodiments in which relative positions of drain and source areas are exchanged, with appropriate changes to angled sub-implants. It will also be recognized by those familiar with integrated circuit fabrication that the advantages of the embodiment discussed in reference to FIG. 4A through FIG. 4C may be realized by similar embodiments in which relative orientations of the asymmetric transistor (4010) and the symmetric transistor (4012) are exchanged, with appropriate changes to angled sub-implants.

Figure 5A:
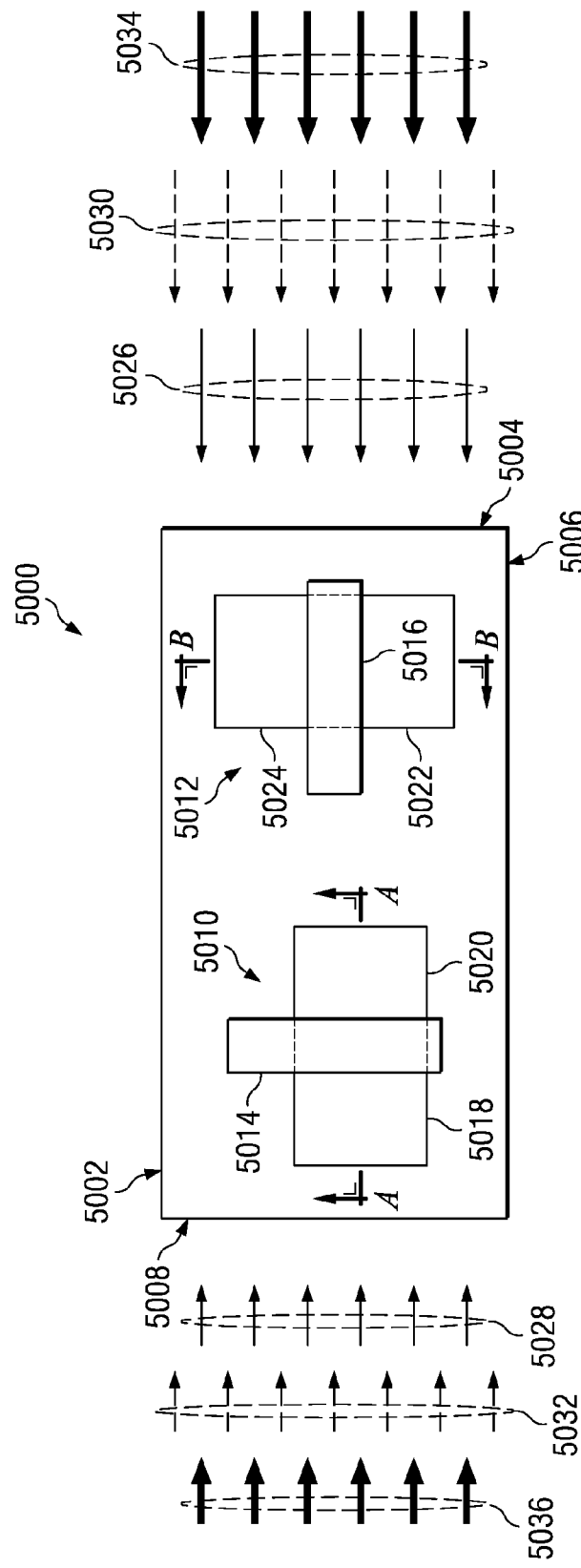
FIG. 5A through FIG. 5C depict an integrated circuit having a symmetric transistor and an asymmetric transistor formed according to a fourth specific embodiment of the instant invention.
Figure 5B:
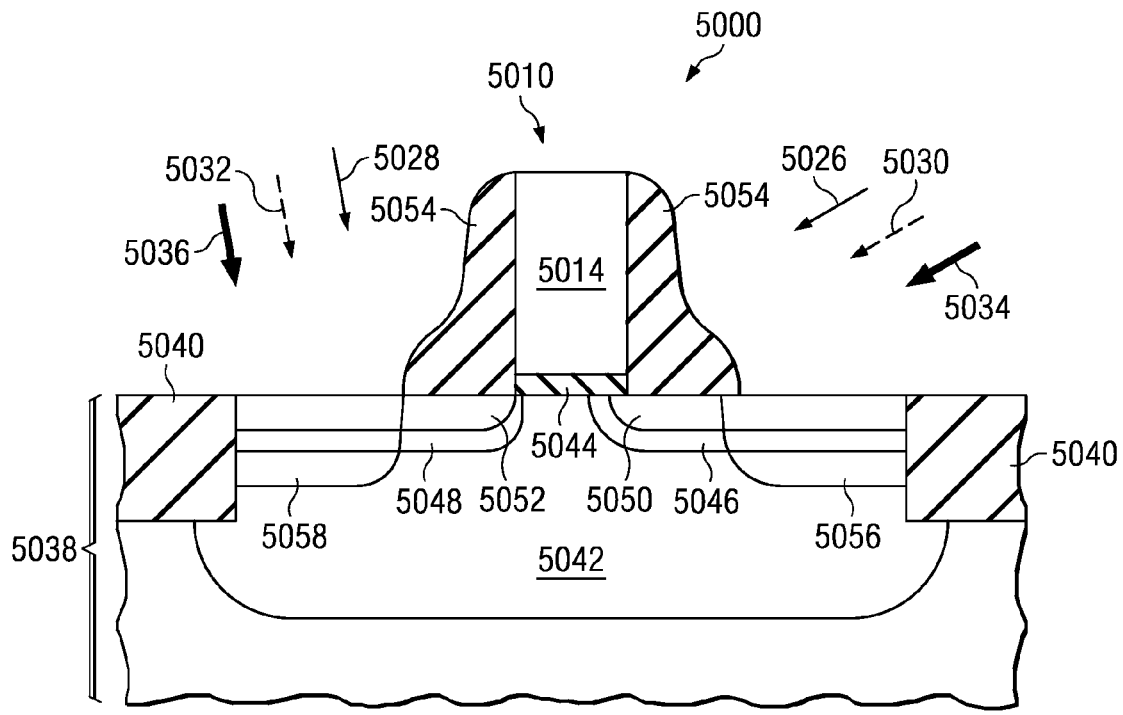
Figure 5C:
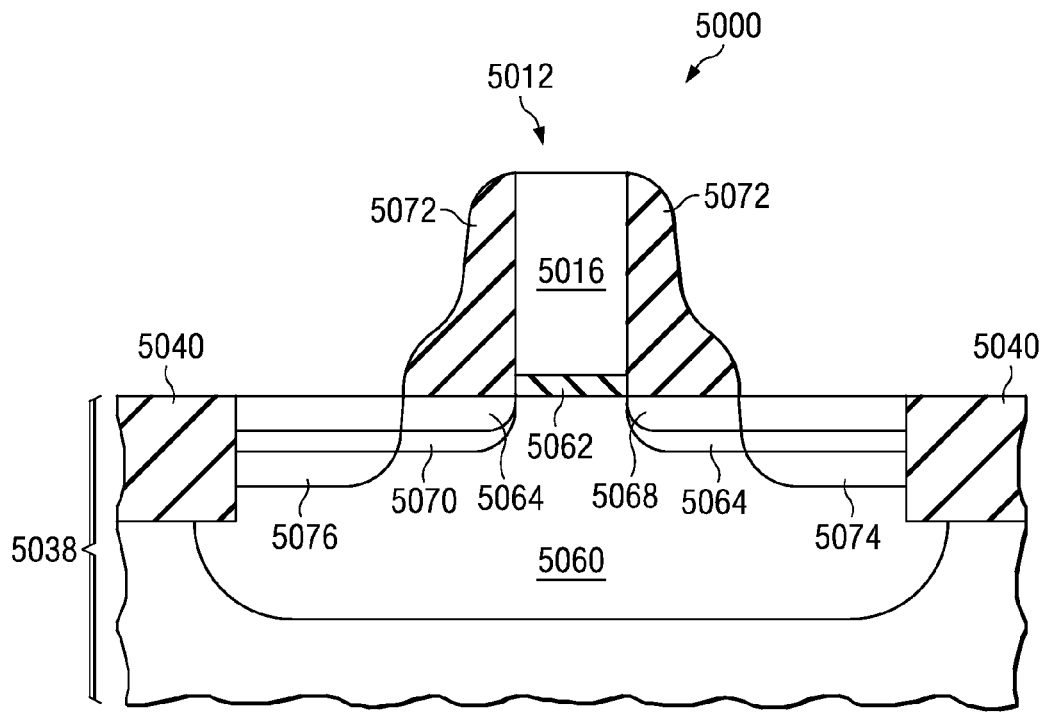

FIG. 5A through FIG. 5C depict an integrated circuit having a symmetric transistor and an asymmetric transistor formed according to a fourth specific embodiment of the instant invention. FIG. 5A is a top view of the integrated circuit (5000) with an upper edge (5002), a right edge (5004), a lower edge (5006) and a left edge (5008). The integrated circuit has an asymmetric transistor (5010) and a symmetric transistor (5012). The asymmetric transistor (5010) has a first gate (5014) with an upper-lower longitudinal axis. The symmetric transistor (5012) has a second gate (5016) with a left-right longitudinal axis. The asymmetric transistor (5010) has a first source area (5018) adjacent to, and on a left side of, the first gate (5014), and a first drain area (5020) adjacent to the first gate (5014) opposite the first source area (5018). The symmetric transistor (5012) has a second source area (5022) adjacent to, and on a lower side of, the second gate (5016), and a second drain area (5024) adjacent to the second gate (5016) opposite the second source area (5022). Other components in the integrated circuit (5000) are not shown in FIG. 5A for clarity.

The asymmetric transistor (5010) and the symmetric transistor (5012) are formed using halo, LDD and S/D ion implant processes which include angled sub-implants to produce halo, LDD and S/D ion implanted layers at a top surface of the integrated circuit (5000). The halo ion implant process has a first halo sub-implant (5026) angled toward the right direction, and a second halo sub-implant (5028) angled toward the left direction. No halo sub-implants angled toward the lower direction or the upper direction are performed in the instant embodiment. A tilt angle of the first halo sub-implant (5026) from the perpendicular axis is equal to or larger than a tilt angle of the second halo sub-implant (5028) from the perpendicular axis. An energy of the first halo sub-implant (5026) is equal to or greater than an energy of the second halo sub-implant (5028). A dose of the first halo sub-implant (5026) is greater than a dose of the second halo sub-implant (5028).

The LDD ion implant process has a first LDD sub-implant (5030) angled toward the right direction, and a second LDD sub-implant (5032) angled toward the left direction. No LDD sub-implants angled toward the lower direction or the upper direction are performed in the instant embodiment. A tilt angle of the first LDD sub-implant (5030) from the perpendicular axis is equal to or larger than a tilt angle of the second LDD sub-implant (5032) from the perpendicular axis. An energy of the first LDD sub-implant (5030) is equal to or greater than an energy of the second LDD sub-implant (5032). A dose of the first LDD sub-implant (5030) is greater than a dose of the second LDD sub-implant (5032).

The S/D ion implant process has a first S/D sub-implant (5034) angled toward the right direction, and a second S/D sub-implant (5036) angled toward the left direction. No S/D sub-implants angled toward the lower direction or the upper direction are performed in the instant embodiment. A tilt angle of the first S/D sub-implant (5034) from the perpendicular axis is equal to or larger than a tilt angle of the second S/D sub-implant (5036) from the perpendicular axis. An energy of the first S/D sub-implant (5034) is equal to or greater than an energy of the second S/D sub-implant (5036). A dose of the first S/D sub-implant (5034) is greater than a dose of the second S/D sub-implant (5036).

FIG. 5B and FIG. 5C are cross-sections of the integrated circuit (5000), through the asymmetric transistor (5010) and the symmetric transistor (5012) depicted in FIG. 5A. FIG. 5B depicts a cross-section at section line A-A of FIG. 5A. FIG. 5C depicts a cross-section at section line B-B of FIG. 5A. Referring to FIG. 5B, the asymmetric transistor (5010) is formed on a substrate (5038) of the integrated circuit (5000), as described in reference to FIG. 1A. Elements of field oxide (5040) are formed at a top surface of the substrate (5038), as described in reference to FIG. 1A. A first well (5042) may be formed in the substrate (5038), as described in reference to FIG. 1A. The asymmetric transistor (5010) has a first gate dielectric layer (5044), formed on a top surface of the substrate (5038) as described in reference to FIG. 1A. The first gate (5014) is formed on a top surface of the first gate dielectric layer (5044), as described in reference to FIG. 1A.

A first drain side halo implanted region (5046) and a first source side halo implanted region (5048) are formed by the first halo sub-implant (5026) and the second halo sub-implant (5028). Spatial distributions of halo dopants in the first drain side halo implanted region (5046) and the first source side halo implanted region (5048) are established by the angles, doses and energies of the halo sub-implants. Because the first halo sub-implant (5026) has a greater dose than the second halo sub-implant (5028) and possibly has a greater energy and/or tilt angle than the second halo sub-implant (5028), a drain side lateral overlap between the first gate (5014) and the first drain side halo implanted region (5046) is larger than a lateral source side overlap with the first source side halo implanted region (5048).

A first drain side LDD implanted region (5050) and a first source side LDD implanted region (5052) are formed by the first LDD sub-implant (5030) and the second LDD sub-implant (5032). Spatial distributions of LDD dopants in the first drain side LDD implanted region (5050) and the first source side LDD implanted region (5052) are established by the angles, doses and energies of the LDD sub-implants. Because the first LDD sub-implant (5030) has a greater dose than the second LDD sub-implant (5032) and possibly has a greater energy and/or tilt angle than the second LDD sub-implant (5032), a drain side lateral overlap between the first gate (5014) and the first drain side LDD implanted region (5050) is larger than a lateral source side overlap with the first source side LDD implanted region (5052).

For illustrative purposes, the first halo sub-implant (5026) and the second halo sub-implant (5028) are depicted in FIG. 5B as having a larger tilt angle from the perpendicular axis than the first LDD sub-implant (5030) and the second LDD sub-implant (5032), respectively, resulting in the first drain side halo implanted region (5046) and the first source side halo implanted region (5048) having larger lateral overlaps with the first gate (5014) than the first drain side LDD implanted region (5050) and the first source side LDD implanted region (5052), respectively. A depth of the first drain side LDD implanted region (5050) and the first source side LDD implanted region (5052) are depicted as less than a depth of the first drain side halo implanted region (5046) and the first source side halo implanted region (5048). It is within the scope of the instant invention to form asymmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants.

A first gate sidewall spacer (5054) is formed on lateral surfaces of the first gate (5014), as described in reference to FIG. 1B. A first drain side S/D implanted region (5056) and a first source side S/D implanted region (5058) are formed by the first S/D sub-implant (5034) and the second S/D sub-implant (5036). Spatial distributions of S/D dopants in the first drain side S/D implanted region (5056) and the first source side S/D implanted region (5058) are established by the angles, doses and energies of the S/D sub-implants.

Because the first S/D sub-implant (5034) has a greater dose than the second S/D sub-implant (5036) and possibly has a greater energy and/or tilt angle than the second S/D sub-implant (5036), a drain side lateral overlap between the first gate sidewall spacer (5054) and the first drain side S/D implanted region (5056) is larger than a lateral source side overlap with the first source side S/D implanted region (5058).

Performing the halo, LDD and S/D implant processes such that gate overlaps of the first drain side halo and LDD implanted regions (5042, 5046) are larger than gate overlaps of the first source side halo and LDD implanted regions (5044, 5048) and the sidewall spacer overlap of the first drain side S/D implanted region (5056) is larger than the sidewall spacer overlap of the first source side S/D implanted region (5058) may advantageously improve a relationship between an on-state current density and an off-state leakage current density of the asymmetric transistor (5010). A depth of the first drain side LDD implanted region (5050) and the first source side LDD implanted region (5052) are depicted as less than a depth of the first drain side halo implanted region (5046) and the first source side halo implanted region (5048). It is within the scope of the instant invention to form asymmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants.

Referring to FIG. 5C, the symmetric transistor (5012) is formed on the substrate (5038) of the integrated circuit (5000), as described in reference to FIG. 1A. Elements of field oxide (5040) are formed at a top surface of the substrate (5038), as described in reference to FIG. 1A. A second well (5060) may be formed in the substrate (5038), as described in reference to FIG. 1A. The symmetric transistor (5012) has a second gate dielectric layer (5062), formed on a top surface of the substrate (5038) as described in reference to FIG. 1A. The second gate (5016) is formed on a top surface of the second gate dielectric layer (5062), as described in reference to FIG. 1A.

A second drain side halo implanted region (5064) and a second source side halo implanted region (5066) are formed by the first halo sub-implant, not shown in FIG. 5C for clarity, and the second halo sub-implant, also not shown in FIG. 5C for clarity. Spatial distributions of halo dopants in the second drain side halo implanted region (5064) and the second source side halo implanted region (5066) are established by the angles, doses and energies of the halo sub-implants. Because the first and second halo sub-implants are symmetric with respect to the left-right longitudinal axis of the second gate (5016), the second drain side halo implanted region (5064) and the second source side halo implanted region (5066) are substantially symmetric with respect to the second gate (5016). A drain side lateral overlap of the second drain side halo implanted region (5064) with the second gate (5016) is substantially equal to a source side lateral overlap of the second source side halo implanted region (5066) with the second gate (5016).

A second drain side LDD implanted region (5068) and a second source side LDD implanted region (5070) are formed by the first LDD sub-implant, not shown in FIG. 5C for clarity, and the second LDD sub-implant, also not shown in FIG. 5C for clarity. Spatial distributions of LDD dopants in the second drain side LDD implanted region (5068) and the second source side LDD implanted region (5070) are established by the angles, doses and energies of the LDD sub-implants. Because the first and second LDD sub-implants are symmetric with respect to the left-right longitudinal axis of the second gate (5016), the second drain side LDD implanted region (5068) and the second source side LDD implanted region (5070) are substantially symmetric with respect to the second gate (5016). A drain side lateral overlap of the second drain side LDD implanted region (5068) with the second gate (5016) is substantially equal to a source side lateral overlap of the second source side LDD implanted region (5070) with the second gate (5016).

A second gate sidewall spacer (5072) is formed on lateral surfaces of the second gate (5016), as described in reference to FIG. 1C. A second drain side S/D implanted region (5074) and a second source side S/D implanted region (5076) are formed by the first S/D sub-implant, not shown in FIG. 5C for clarity, and the second S/D sub-implant, also not shown in FIG. 5C for clarity. Spatial distributions of S/D dopants in the second drain side S/D implanted region (5074) and the second source side S/D implanted region (5076) are established by the angles, doses and energies of the S/D sub-implants. Because the first and second S/D sub-implants are symmetric with respect to the left-right longitudinal axis of the second gate (5016), the second drain side S/D implanted region (5074) and the second source side S/D implanted region (5076) are substantially symmetric with respect to the second gate (5016). A drain side lateral overlap of the second drain side S/D implanted region (5074) with the second gate (5016) is substantially equal to a source side lateral overlap of the second source side S/D implanted region (5076) with the second gate (5016).

It will be recognized by those familiar with integrated circuit fabrication that the advantages of the embodiment discussed in reference to FIG. 5A through FIG. 5C may be realized by similar embodiments in which relative positions of drain and source areas are exchanged, with appropriate changes to angled sub-implants. It will also be recognized by those familiar with integrated circuit fabrication that the advantages of the embodiment discussed in reference to FIG. 5A through FIG. 5C may be realized by similar embodiments in which relative orientations of the asymmetric transistor (5010) and the symmetric transistor (5012) are exchanged, with appropriate changes to angled sub-implants.

Figure 6A:
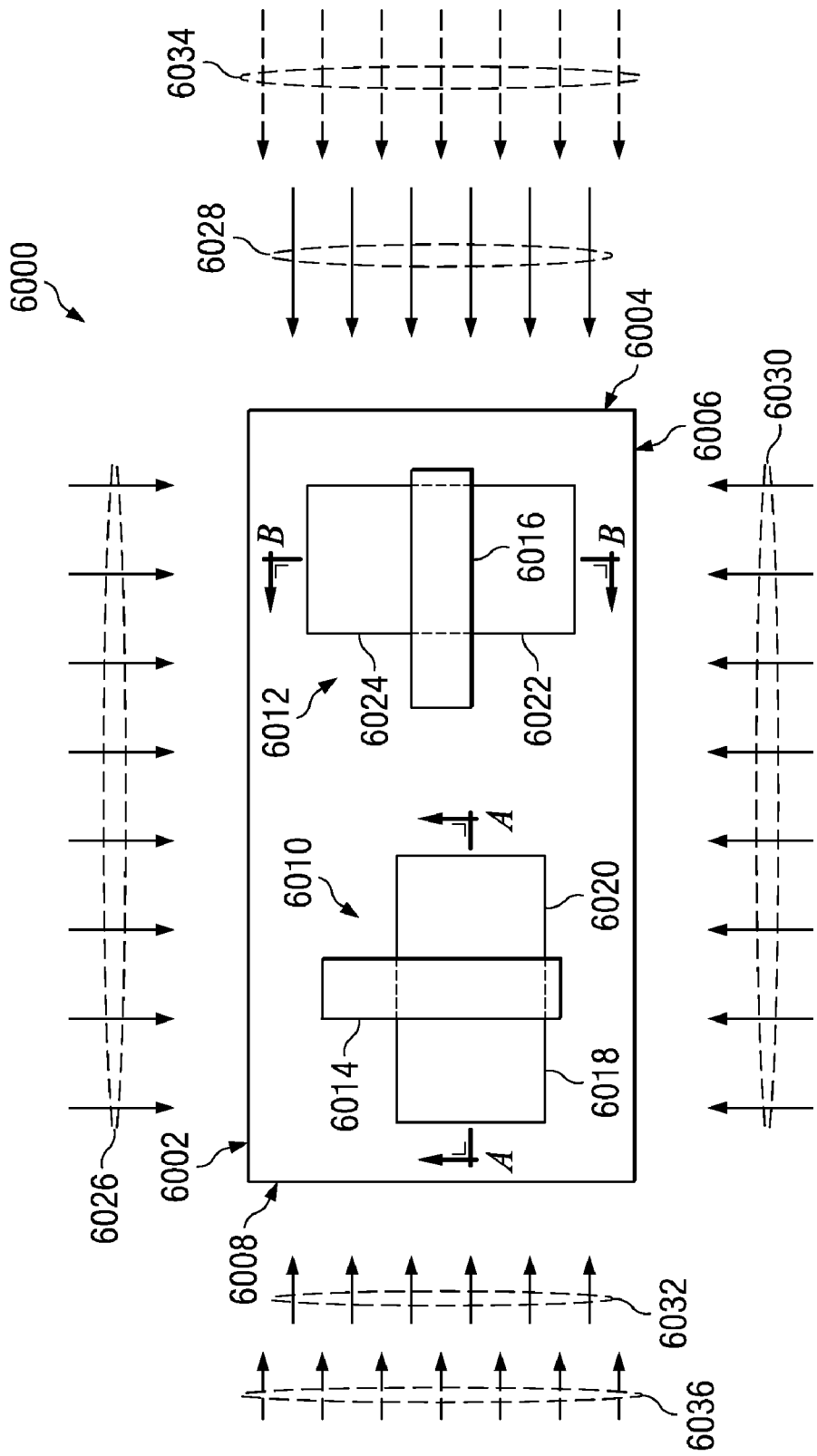
FIG. 6A through FIG. 6C depict an integrated circuit having a symmetric transistor and an asymmetric transistor formed according to a fifth specific embodiment of the instant invention.
Figure 6B:
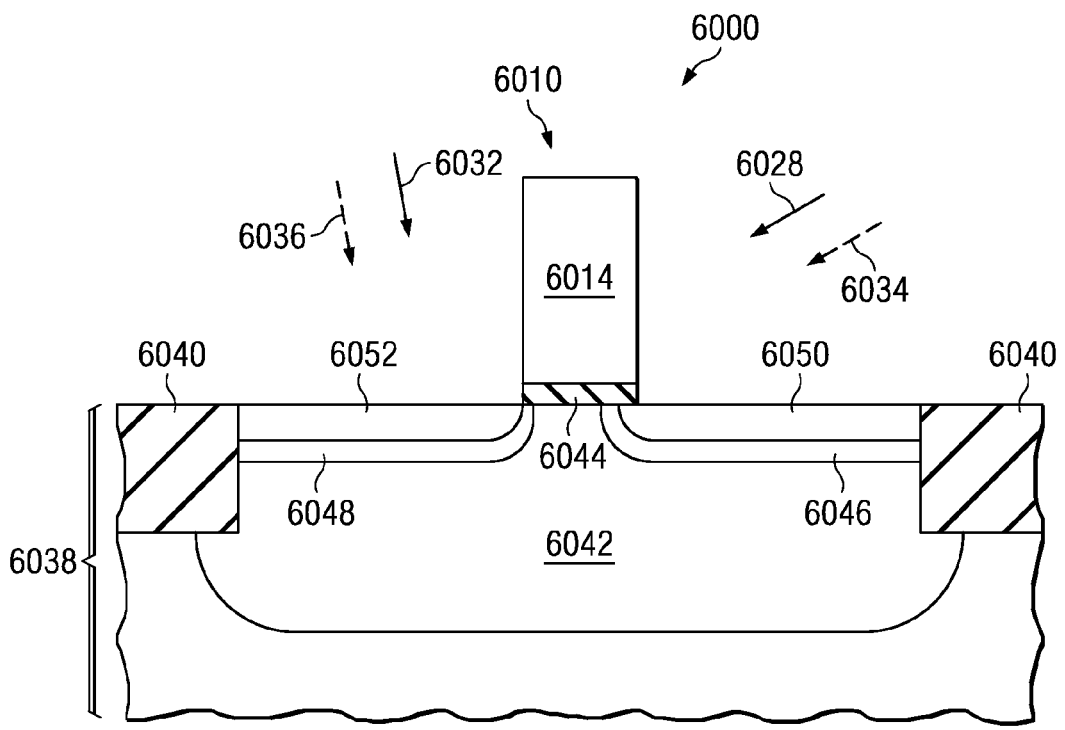
Figure 6C:
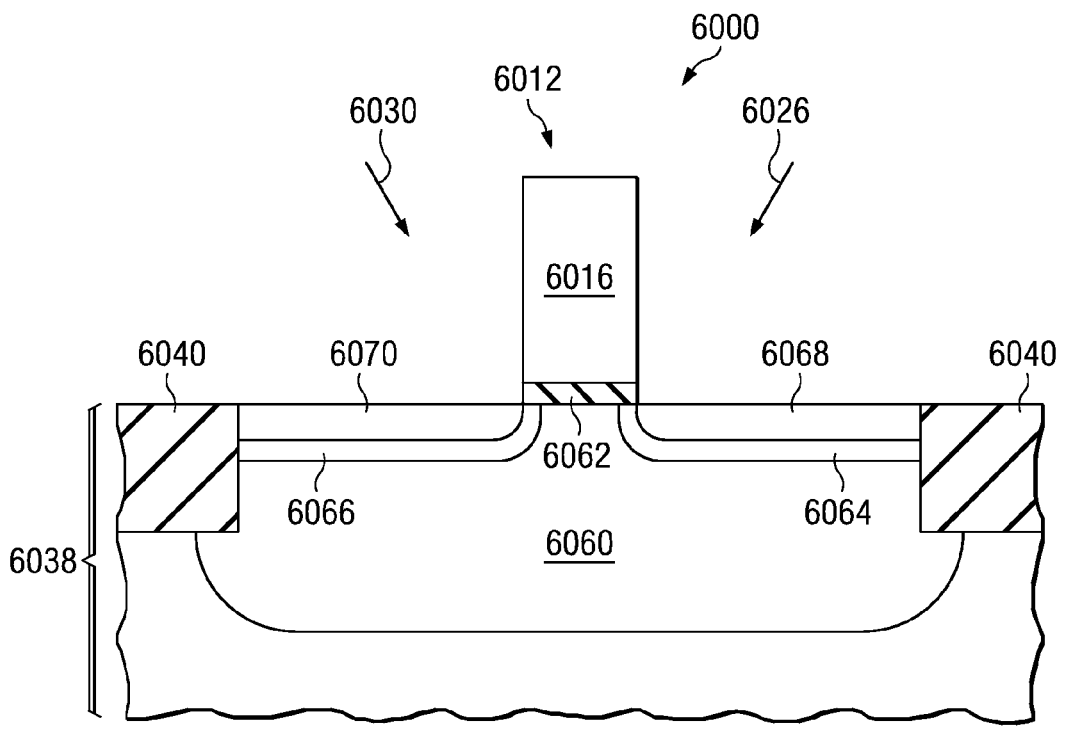

FIG. 6A through FIG. 6C depict an integrated circuit having a symmetric transistor and an asymmetric transistor formed according to a fifth specific embodiment of the instant invention. FIG. 6A is a top view of the integrated circuit (6000) with an upper edge (6002), a right edge (6004), a lower edge (6006) and a left edge (6008). The integrated circuit has an asymmetric transistor (6010) and a symmetric transistor (6012). The asymmetric transistor (6010) has a first gate (6014) with an upper-lower longitudinal axis. The symmetric transistor (6012) has a second gate (6016) with a left-right longitudinal axis. The asymmetric transistor (6010) has a first source area (6018) adjacent to, and on a left side of, the first gate (6014), and a first drain area (6020) adjacent to the first gate (6014) opposite the first source area (6018). The symmetric transistor (6012) has a second source area (6022) adjacent to, and on a lower side of, the second gate (6016), and a second drain area (6024) adjacent to the second gate (6016) opposite the second source area (6022). Other components in the integrated circuit (6000) are not shown in FIG. 6A for clarity.

The asymmetric transistor (6010) and the symmetric transistor (6012) are formed using halo and LDD ion implant processes which include angled sub-implants to produce halo and LDD ion implanted layers at a top surface of the integrated circuit (6000). The halo ion implant process has a first halo sub-implant (6026) angled toward the upper direction, a second halo sub-implant (6028) angled toward the right direction, a third halo sub-implant (6030) angled toward the lower direction, and a fourth halo sub-implant (6032) angled toward the left direction. A tilt angle of the second halo sub-implant (6028) from the perpendicular axis is equal to or larger than a tilt angle of the third halo sub-implant (6032) from the perpendicular axis. An energy of the second halo sub-implant (6028) is equal to or greater than an energy of the fourth halo sub-implant (6032). A dose of the second halo sub-implant (6028) is greater than a dose of the fourth halo sub-implant (6032). A tilt angle of the first halo sub-implant (6026) is substantially equal to a tilt angle of the third halo sub-implant (6030) from the perpendicular axis. An energy and dose of the first halo sub-implant (6026) are substantially equal to an energy and dose of the third halo sub-implant (6030).

The LDD ion implant process has a first LDD sub-implant (6034) angled toward the right direction, and a second LDD sub-implant (6036) angled toward the left direction. No LDD sub-implants angled toward the lower direction or the upper direction are performed in the instant embodiment. A tilt angle of the first LDD sub-implant (6034) from the perpendicular axis is equal to or larger than a tilt angle of the second LDD sub-implant (6036) from the perpendicular axis. An energy of the first LDD sub-implant (6034) is equal to or greater than an energy of the second LDD sub-implant (6036). A dose of the first LDD sub-implant (6034) is greater than a dose of the second LDD sub-implant (6036).

FIG. 6B and FIG. 6C are cross-sections of the integrated circuit (6000), through the asymmetric transistor (6010) and the symmetric transistor (6012) depicted in FIG. 6A. FIG. 6B depicts a cross-section at section line A-A of FIG. 6A. FIG. 6C depicts a cross-section at section line B-B of FIG. 6A. Referring to FIG. 6B, the asymmetric transistor (6010) is formed on a substrate (6038) of the integrated circuit (6000), as described in reference to FIG. 1A. Elements of field oxide (6040) are formed at a top surface of the substrate (6038), as described in reference to FIG. 1A. A first well (6042) may be formed in the substrate (6038), as described in reference to FIG. 1A. The asymmetric transistor (6010) has a first gate dielectric layer (6044), formed on a top surface of the substrate (6038) as described in reference to FIG. 1A. The first gate (6014) is formed on a top surface of the first gate dielectric layer (6044), as described in reference to FIG. 1A.

A first drain side halo implanted region (6046) and a first source side halo implanted region (6048) are formed by the first halo sub-implant, not shown in FIG. 6B for clarity, the second halo sub-implant (6028), the third halo sub-implant, not shown in FIG. 6B for clarity, and the fourth halo sub-implant (6032). Spatial distributions of halo dopants in the first drain side halo implanted region (6046) and the first source side halo implanted region (6048) are established by the angles, doses and energies of the halo sub-implants. Because the second halo sub-implant (6028) has a greater dose than the fourth halo sub-implant (6032) and possibly has a greater energy and/or tilt angle than the fourth halo sub-implant (6032), a drain side lateral overlap between the first gate (6014) and the first drain side halo implanted region (6046) is larger than a lateral source side overlap with the first source side halo implanted region (6048).

A first drain side LDD implanted region (6050) and a first source side LDD implanted region (6052) are formed by the first LDD sub-implant (6034) and the second LDD sub-implant (6036). Spatial distributions of LDD dopants in the first drain side LDD implanted region (6050) and the first source side LDD implanted region (6052) are established by the angles, doses and energies of the LDD sub-implants. Because the first LDD sub-implant (6034) has a greater dose than the second LDD sub-implant (6036) and possibly has a greater energy and/or tilt angle than the second LDD sub-implant (6036), a drain side lateral overlap between the first gate (6014) and the first drain side LDD implanted region (6050) is larger than a lateral source side overlap with the first source side LDD implanted region (6052).

For illustrative purposes, the second halo sub-implant (6028) and the fourth halo sub-implant (6032) are depicted in FIG. 6B as having a larger tilt angle from the perpendicular axis than the first LDD sub-implant (6034) and the second LDD sub-implant (6036), respectively, resulting in the first drain side halo implanted region (6046) and the first source side halo implanted region (6048) having larger lateral overlaps with the first gate (6014) than the first drain side LDD implanted region (6050) and the first source side LDD implanted region (6052), respectively. A depth of the first drain side LDD implanted region (6050) and the first source side LDD implanted region (6052) are depicted as less than a depth of the first drain side halo implanted region (6046) and the first source side halo implanted region (6048). It is within the scope of the instant invention to form asymmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants. Performing the halo and LDD implant processes such that gate overlaps of the first drain side halo and LDD implanted regions (6046, 6050) are larger than gate overlaps of the first source side halo and LDD implanted regions (6048, 6052) may advantageously improve a relationship between an on-state current density and an off-state leakage current density of the asymmetric transistor (6010).

Referring to FIG. 6C, the symmetric transistor (6012) is formed on the substrate (6038) of the integrated circuit (6000), as described in reference to FIG. 1A. Elements of field oxide (6040) are formed at a top surface of the substrate (6038), as described in reference to FIG. 1A. A second well (6060) may be formed in the substrate (6038), as described in reference to FIG. 1A. The symmetric transistor (6012) has a second gate dielectric layer (6062), formed on a top surface of the substrate (6038) as described in reference to FIG. 1A. The second gate (6016) is formed on a top surface of the second gate dielectric layer (6062), as described in reference to FIG. 1A.

A second drain side halo implanted region (6064) and a second source side halo implanted region (6066) are formed by the first halo sub-implant, the second halo sub-implant (6028), not shown in FIG. 6B for clarity, the third halo sub-implant, and the fourth halo sub-implant (6032), not shown in FIG. 6B for clarity. Spatial distributions of halo dopants in the second drain side halo implanted region (6064) and the second source side halo implanted region (6066) are established by the angles, doses and energies of the halo sub-implants. Because the first and third halo sub-implants (6026, 6030) are symmetric with respect to the left-right longitudinal axis of the second gate (6016), and because the second and fourth halo sub-implants (6028, 6032) have substantially equal angles, doses and energies, the second drain side halo implanted region (6064) and the second source side halo implanted region (6066) are substantially symmetric with respect to the second gate (6016). A drain side lateral overlap of the second drain side halo implanted region (6064) with the second gate (6016) is substantially equal to a source side lateral overlap of the second source side halo implanted region (6066) with the second gate (6016).

A second drain side LDD implanted region (6068) and a second source side LDD implanted region (6070) are formed by the first LDD sub-implant, not shown in FIG. 6C for clarity, and the second LDD sub-implant, also not shown in FIG. 6C for clarity. Spatial distributions of LDD dopants in the second drain side LDD implanted region (6068) and the second source side LDD implanted region (6070) are established by the angles, doses and energies of the LDD sub-implants. Because the first and second LDD sub-implants are symmetric with respect to the left-right longitudinal axis of the second gate (6016), the second drain side LDD implanted region (6068) and the second source side LDD implanted region (6070) are substantially symmetric with respect to the second gate (6016). A drain side lateral overlap of the second drain side LDD implanted region (6068) with the second gate (6016) is substantially equal to a source side lateral overlap of the second source side LDD implanted region (6070) with the second gate (6016).

It will be recognized by those familiar with integrated circuit fabrication that the advantages of the embodiment discussed in reference to FIG. 6A through FIG. 6C may be realized by similar embodiments in which relative positions of drain and source areas are exchanged, with appropriate changes to angled sub-implants. It will also be recognized by those familiar with integrated circuit fabrication that the advantages of the embodiment discussed in reference to FIG. 6A through FIG. 6C may be realized by similar embodiments in which relative orientations of the asymmetric transistor (6010) and the symmetric transistor (6012) are exchanged, with appropriate changes to angled sub-implants.

Figure 7A:
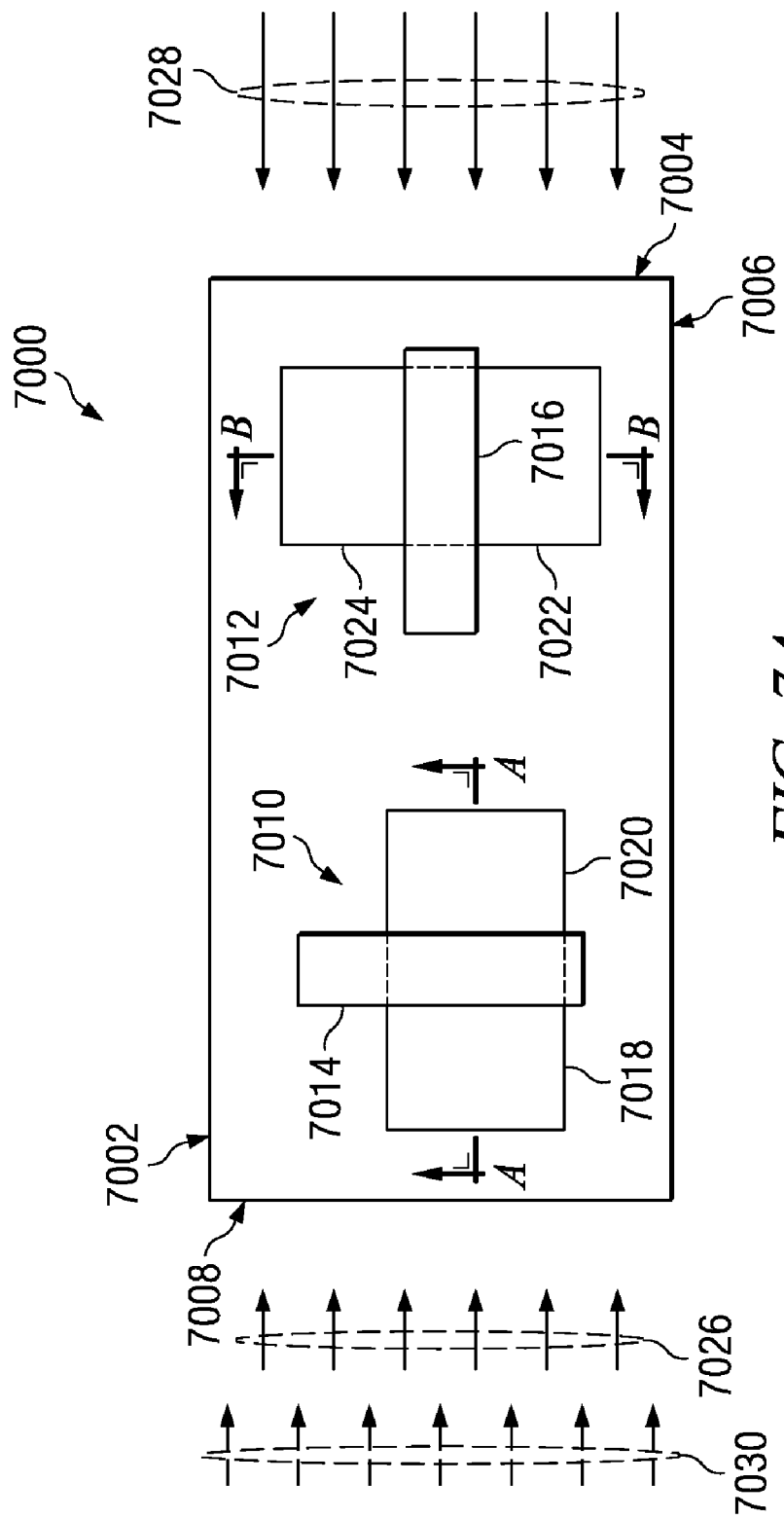
FIG. 7A through FIG. 7C depict an integrated circuit having a symmetric transistor and an asymmetric transistor formed according to a sixth specific embodiment of the instant invention.
Figure 7B:
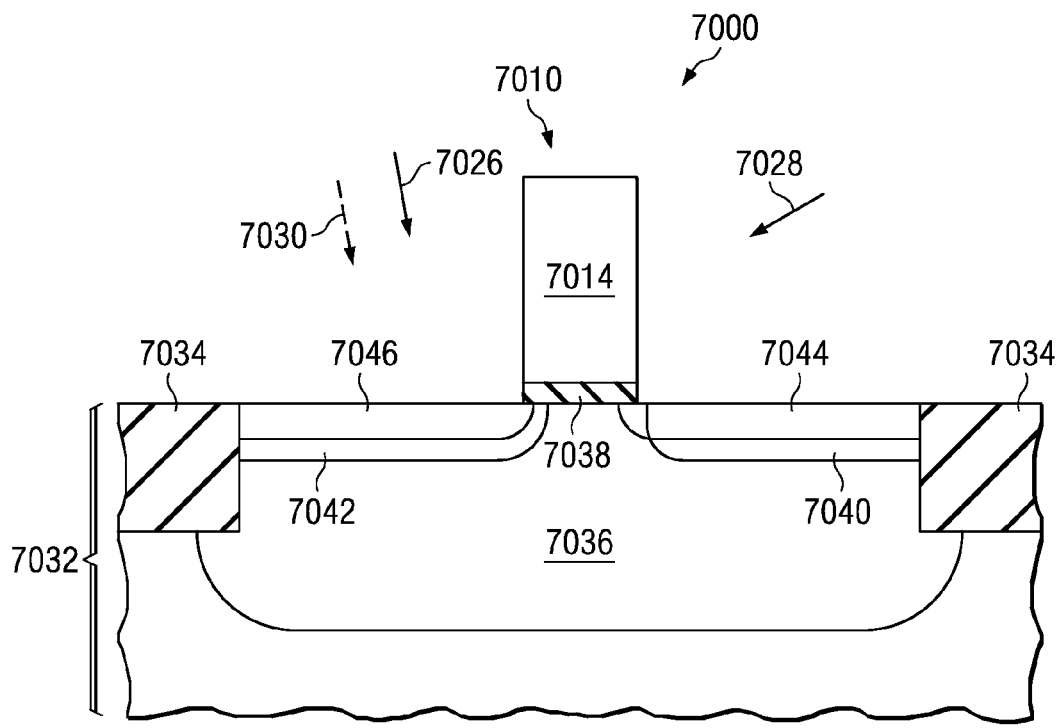
Figure 7C:
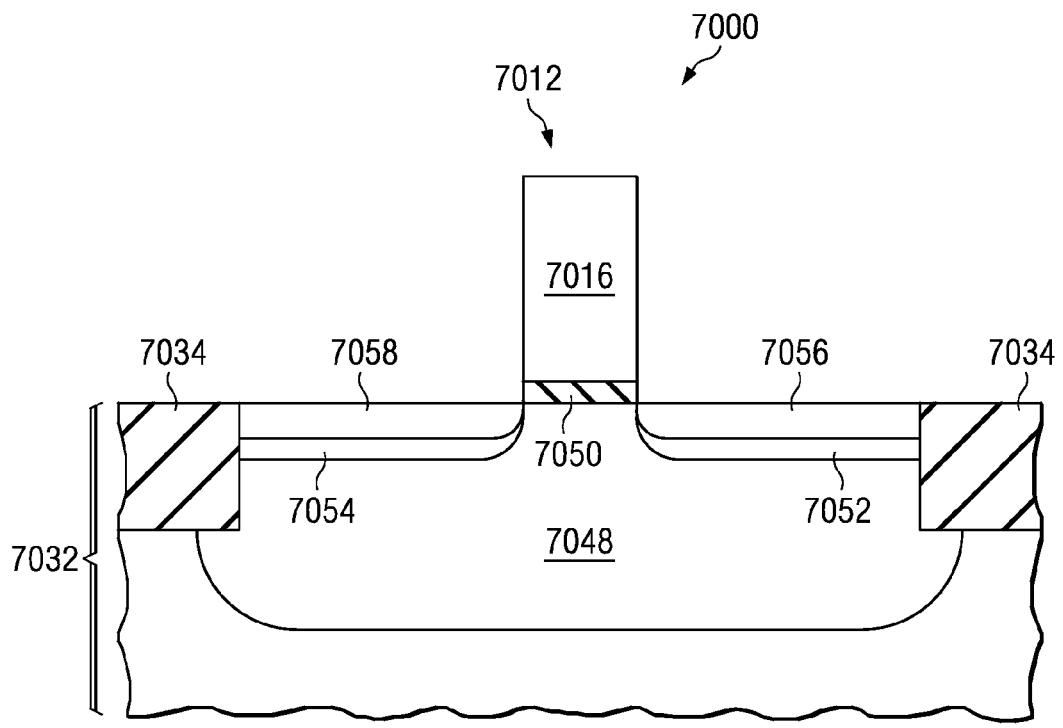

FIG. 7A through FIG. 7C depict an integrated circuit having a symmetric transistor and an asymmetric transistor formed according to a sixth specific embodiment of the instant invention. FIG. 7A is a top view of the integrated circuit (7000) with an upper edge (7002), a right edge (7004), a lower edge (7006) and a left edge (7008). The integrated circuit has an asymmetric transistor (7010) and a symmetric transistor (7012). The asymmetric transistor (7010) has a first gate (7014) with an upper-lower longitudinal axis. The symmetric transistor (7012) has a second gate (7016) with a left-right longitudinal axis. The asymmetric transistor (7010) has a first source area (7018) adjacent to, and on a left side of, the first gate (7014), and a first drain area (7020) adjacent to the first gate (7014) opposite the first source area (7018). The symmetric transistor (7012) has a second source area (7022) adjacent to, and on a lower side of, the second gate (7016), and a second drain area (7024) adjacent to the second gate (7016) opposite the second source area (7022). Other components in the integrated circuit (7000) are not shown in FIG. 7A for clarity.

The asymmetric transistor (7010) and the symmetric transistor (7012) are formed using halo and LDD ion implant processes which include angled sub-implants to produce halo and LDD ion implanted layers at a top surface of the integrated circuit (7000). The halo ion implant process has one halo sub-implant (7026) angled toward the left direction. No halo sub-implants angled toward the upper, right or lower directions are performed in the instant embodiment.

The LDD ion implant process has a first LDD sub-implant (7028) angled toward the right direction, and a second LDD sub-implant (7030) angled toward the left direction. No LDD sub-implants angled toward the lower direction or the upper direction are performed in the instant embodiment. A tilt angle of the first LDD sub-implant (7028) from the perpendicular axis is equal to or larger than a tilt angle of the second LDD sub-implant (7030) from the perpendicular axis. An energy of the first LDD sub-implant (7028) is equal to or greater than an energy of the second LDD sub-implant (7030). A dose of the first LDD sub-implant (7028) is greater than a dose of the second LDD sub-implant (7030).

FIG. 7B and FIG. 7C are cross-sections of the integrated circuit (7000), through the asymmetric transistor (7010) and the symmetric transistor (7012) depicted in FIG. 7A. FIG. 7B depicts a cross-section at section line A-A of FIG. 7A. FIG. 7C depicts a cross-section at section line B-B of FIG. 7A. Referring to FIG. 7B, the asymmetric transistor (7010) is formed on a substrate (7032) of the integrated circuit (7000), as described in reference to FIG. 1A. Elements of field oxide (7034) are formed at a top surface of the substrate (7032), as described in reference to FIG. 1A. A first well (7036) may be formed in the substrate (7032), as described in reference to FIG. 1A. The asymmetric transistor (7010) has a first gate dielectric layer (7038), formed on a top surface of the substrate (7032) as described in reference to FIG. 1A. The first gate (7014) is formed on a top surface of the first gate dielectric layer (7038), as described in reference to FIG. 1A.

A first drain side halo implanted region (7040) and a first source side halo implanted region (7042) are formed by the halo sub-implant (7026). Spatial distributions of halo dopants in the first drain side halo implanted region (7040) and the first source side halo implanted region (7042) are established by the angle, dose and energy of the halo sub-implant. Because the halo sub-implant (7026) is tilted toward the left direction, a drain side lateral overlap between the first gate (7014) and the first drain side halo implanted region (7040) is less than a lateral source side overlap with the first source side halo implanted region (7042).

A first drain side LDD implanted region (7044) and a first source side LDD implanted region (7046) are formed by the first LDD sub-implant (7028) and the second LDD sub-implant (7030). Spatial distributions of LDD dopants in the first drain side LDD implanted region (7044) and the first source side LDD implanted region (7046) are established by the angles, doses and energies of the LDD sub-implants. Because the first LDD sub-implant (7028) has a greater dose than the second LDD sub-implant (7030) and possibly has a greater energy and/or tilt angle than the second LDD sub-implant (7030), a drain side lateral overlap between the first gate (7014) and the first drain side LDD implanted region (7044) is larger than a lateral source side overlap with the first source side LDD implanted region (7046).

For illustrative purposes, the halo sub-implant (7026) is depicted in FIG. 7B as having a larger tilt angle from the perpendicular axis than the second LDD sub-implant (7030), respectively, resulting in the first source side halo implanted region (7042) having a larger lateral overlap with the first gate (7014) than the first source side LDD implanted region (7046). A depth of the first drain side LDD implanted region (7044) and the first source side LDD implanted region (7046) are depicted as less than a depth of the first drain side halo implanted region (7040) and the first source side halo implanted region (7042). It is within the scope of the instant invention to form asymmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants. Performing the halo and LDD implant processes such that a gate overlap of the first drain side halo implanted region (7040) is less than a gate overlap of the first source side halo implanted region (7042) while a gate overlap of the first drain side LDD implanted region (7044) is larger than a gate overlap of the first source side LDD implanted region (7046) may advantageously improve a relationship between an on-state current density and an off-state leakage current density of the asymmetric transistor (7010).

Referring to FIG. 7C, the symmetric transistor (7012) is formed on the substrate (7032) of the integrated circuit (7000), as described in reference to FIG. 1A. Elements of field oxide (7034) are formed at a top surface of the substrate (7032), as described in reference to FIG. 1A. A second well (7048) may be formed in the substrate (7032), as described in reference to FIG. 1A. The symmetric transistor (7012) has a second gate dielectric layer (7050), formed on a top surface of the substrate (7032) as described in reference to FIG. 1A. The second gate (7016) is formed on a top surface of the second gate dielectric layer (7050), as described in reference to FIG. 1A.

A second drain side halo implanted region (7052) and a second source side halo implanted region (7054) are formed by the halo sub-implant (7026), not shown in FIG. 7C for clarity. Spatial distributions of halo dopants in the second drain side halo implanted region (7052) and the second source side halo implanted region (7054) are established by the angle, dose and energy of the halo sub-implant. Because the halo sub-implant is symmetric with respect to the left-right longitudinal axis of the second gate (7016), the second drain side halo implanted region (7052) and the second source side halo implanted region (7054) are substantially symmetric with respect to the second gate (7016). A drain side lateral overlap of the second drain side halo implanted region (7052) with the second gate (7016) is substantially equal to a source side lateral overlap of the second source side halo implanted region (7054) with the second gate (7016).

A second drain side LDD implanted region (7056) and a second source side LDD implanted region (7058) are formed by the first LDD sub-implant, not shown in FIG. 7C for clarity, and the second LDD sub-implant, also not shown in FIG. 7C for clarity. Spatial distributions of LDD dopants in the second drain side LDD implanted region (7056) and the second source side LDD implanted region (7058) are established by the angles, doses and energies of the LDD sub-implants. Because the first and second LDD sub-implants are symmetric with respect to the left-right longitudinal axis of the second gate (7016), the second drain side LDD implanted region (7056) and the second source side LDD implanted region (7058) are substantially symmetric with respect to the second gate (7016). A drain side lateral overlap of the second drain side LDD implanted region (7056) with the second gate (7016) is substantially equal to a source side lateral overlap of the second source side LDD implanted region (7058) with the second gate (7016).

It will be recognized by those familiar with integrated circuit fabrication that the advantages of the embodiment discussed in reference to FIG. 7A through FIG. 7C may be realized by similar embodiments in which relative positions of drain and source areas are exchanged, with appropriate changes to angled sub-implants. It will also be recognized by those familiar with integrated circuit fabrication that the advantages of the embodiment discussed in reference to FIG. 7A through FIG. 7C may be realized by similar embodiments in which relative orientations of the asymmetric transistor (7010) and the symmetric transistor (7012) are exchanged, with appropriate changes to angled sub-implants.

Figure 8A:
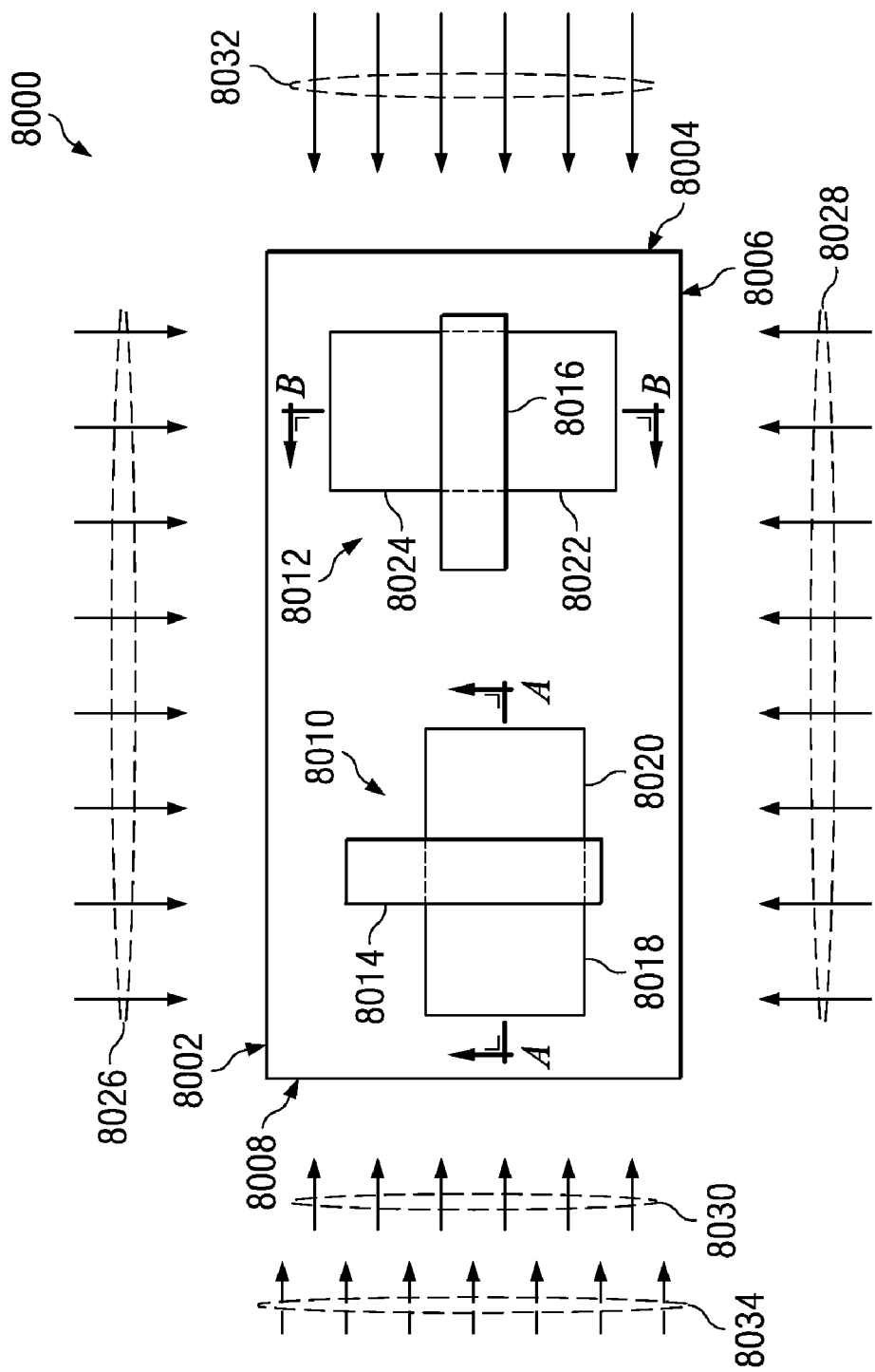
FIG. 8A through FIG. 8C depict an integrated circuit having a symmetric transistor and an asymmetric transistor formed according to a seventh specific embodiment of the instant invention.
Figure 8B:
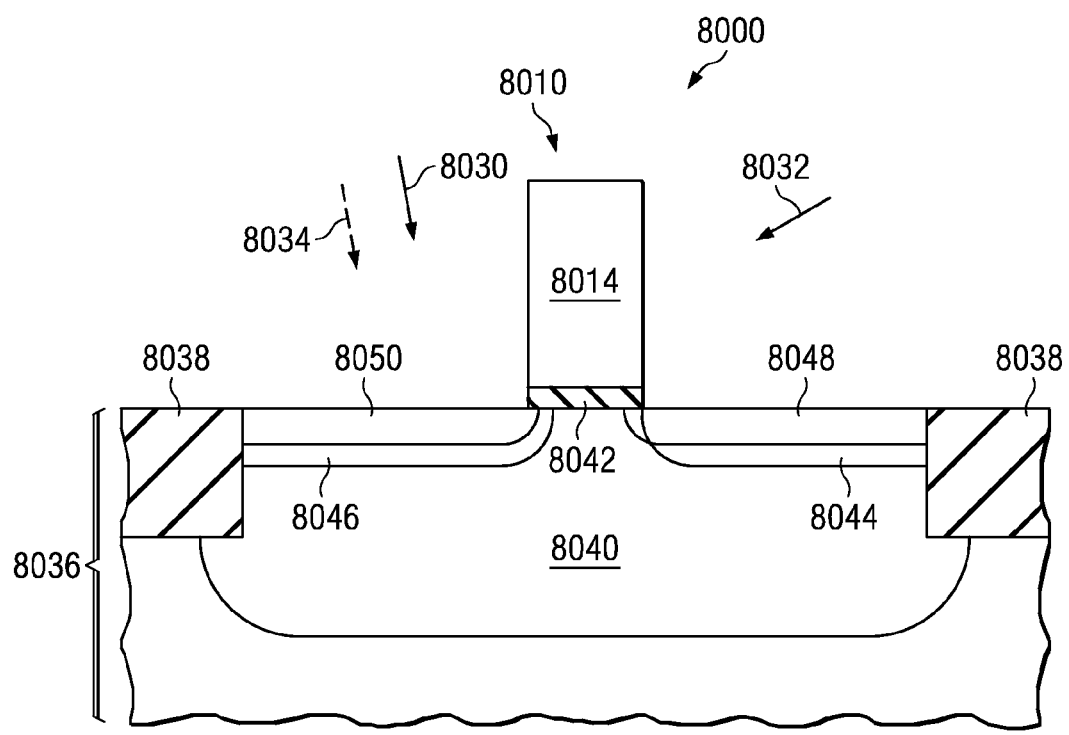
Figure 8C:
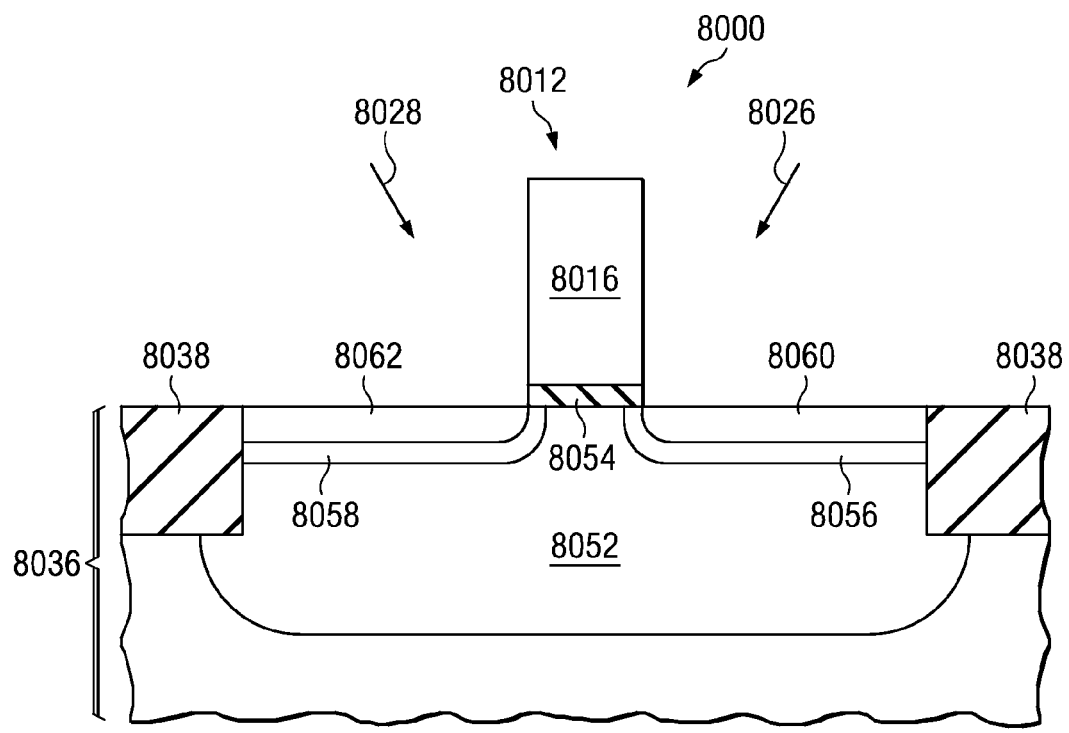

FIG. 8A through FIG. 8C depict an integrated circuit having a symmetric transistor and an asymmetric transistor formed according to a seventh specific embodiment of the instant invention. FIG. 8A is a top view of the integrated circuit (8000) with an upper edge (8002), a right edge (8004), a lower edge (8006) and a left edge (8008). The integrated circuit has an asymmetric transistor (8010) and a symmetric transistor (8012). The asymmetric transistor (8010) has a first gate (8014) with an upper-lower longitudinal axis. The symmetric transistor (8012) has a second gate (8016) with a left-right longitudinal axis. The asymmetric transistor (8010) has a first source area (8018) adjacent to, and on a left side of, the first gate (8014), and a first drain area (8020) adjacent to the first gate (8014) opposite the first source area (8018). The symmetric transistor (8012) has a second source area (8022) adjacent to, and on a lower side of, the second gate (8016), and a second drain area (8024) adjacent to the second gate (8016) opposite the second source area (8022). Other components in the integrated circuit (8000) are not shown in FIG. 8A for clarity.

The asymmetric transistor (8010) and the symmetric transistor (8012) are formed using halo and LDD ion implant processes which include angled sub-implants to produce halo and LDD ion implanted layers at a top surface of the integrated circuit (8000). The halo ion implant process has a first halo sub-implant (8026) angled toward the upper direction, a second halo sub-implant (8028) angled toward the lower direction, and a third halo sub-implant (8030) angled toward the left direction. A tilt angle of the first halo sub-implant (8026) is substantially equal to a tilt angle of the second halo sub-implant (8028) from the perpendicular axis. An energy and dose of the first halo sub-implant (8026) are substantially equal to an energy and dose of the second halo sub-implant (8028).

The LDD ion implant process has a first LDD sub-implant (8032) angled toward the right direction, and a second LDD sub-implant (8034) angled toward the left direction. No LDD sub-implants angled toward the lower direction or the upper direction are performed in the instant embodiment. A tilt angle of the first LDD sub-implant (8032) from the perpendicular axis is equal to or larger than a tilt angle of the second LDD sub-implant (8034) from the perpendicular axis. An energy of the first LDD sub-implant (8032) is equal to or greater than an energy of the second LDD sub-implant (8034). A dose of the first LDD sub-implant (8032) is greater than a dose of the second LDD sub-implant (8034).

FIG. 8B and FIG. 8C are cross-sections of the integrated circuit (8000), through the asymmetric transistor (8010) and the symmetric transistor (8012) depicted in FIG. 8A. FIG. 8B depicts a cross-section at section line A-A of FIG. 8A. FIG. 8C depicts a cross-section at section line B-B of FIG. 8A. Referring to FIG. 8B, the asymmetric transistor (8010) is formed on a substrate (8036) of the integrated circuit (8000), as described in reference to FIG. 1A. Elements of field oxide (8038) are formed at a top surface of the substrate (8036), as described in reference to FIG. 1A. A first well (8040) may be formed in the substrate (8036), as described in reference to FIG. 1A. The asymmetric transistor (8010) has a first gate dielectric layer (8042), formed on a top surface of the substrate (8036) as described in reference to FIG. 1A. The first gate (8014) is formed on a top surface of the first gate dielectric layer (8042), as described in reference to FIG. 1A.

A first drain side halo implanted region (8044) and a first source side halo implanted region (8046) are formed by the first halo sub-implant, not shown in FIG. 8B for clarity, the second halo sub-implant, also not shown in FIG. 8B for clarity, and the third halo sub-implant (8026). Spatial distributions of halo dopants in the first drain side halo implanted region (8044) and the first source side halo implanted region (8046) are established by the angles, doses and energies of the halo sub-implants. Because the third halo sub-implant (8030) is tilted toward the left direction, a drain side lateral overlap between the first gate (8014) and the first drain side halo implanted region (8044) is less than a lateral source side overlap with the first source side halo implanted region (8046).

A first drain side LDD implanted region (8048) and a first source side LDD implanted region (8050) are formed by the first LDD sub-implant (8032) and the second LDD sub-implant (8034). Spatial distributions of LDD dopants in the first drain side LDD implanted region (8048) and the first source side LDD implanted region (8050) are established by the angles, doses and energies of the LDD sub-implants (8032, 8034). Because the first LDD sub-implant (8032) has a greater dose than the second LDD sub-implant (8034) and possibly has a greater energy and/or tilt angle than the second LDD sub-implant (8034), a drain side lateral overlap between the first gate (8014) and the first drain side LDD implanted region (8048) is larger than a lateral source side overlap with the first source side LDD implanted region (8050).

For illustrative purposes, a depth of the first drain side LDD implanted region (8048) and the first source side LDD implanted region (8050) are depicted as less than a depth of the first drain side halo implanted region (8044) and the first source side halo implanted region (8046). It is within the scope of the instant invention to form asymmetric transistors with upper-lower gate longitudinal axes having different lateral overlaps of halo implanted regions and LDD implanted regions with gates and different depths of halo implanted regions and LDD implanted regions, by adjusting tilt angles, doses, energies, and species of halo sub-implants and LDD sub implants. Performing the halo and LDD implant processes such that gate overlaps of the first drain side halo and LDD implanted regions (8046, 8050) are larger than gate overlaps of the first source side halo and LDD implanted regions (8048, 8052) may advantageously improve a relationship between an on-state current density and an off-state leakage current density of the asymmetric transistor (8010).

Referring to FIG. 8C, the symmetric transistor (8012) is formed on the substrate (8036) of the integrated circuit (8000), as described in reference to FIG. 1A. Elements of field oxide (8038) are formed at a top surface of the substrate (8036), as described in reference to FIG. 1A. A second well (8052) may be formed in the substrate (8036), as described in reference to FIG. 1A. The symmetric transistor (8012) has a second gate dielectric layer (8054), formed on a top surface of the substrate (8036) as described in reference to FIG. 1A. The second gate (8016) is formed on a top surface of the second gate dielectric layer (8054), as described in reference to FIG. 1A.

A second drain side halo implanted region (8056) and a second source side halo implanted region (8058) are formed by the first halo sub-implant (8026) and the second halo sub-implant (8028). Spatial distributions of halo dopants in the second drain side halo implanted region (8056) and the second source side halo implanted region (8058) are established by the angles, doses and energies of the halo sub-implants. Because the first and second halo sub-implants (8026, 8028) are symmetric with respect to the left-right longitudinal axis of the second gate (8016), the second drain side halo implanted region (8056) and the second source side halo implanted region (8058) are substantially symmetric with respect to the second gate (8016). A drain side lateral overlap of the second drain side halo implanted region (8056) with the second gate (8016) is substantially equal to a source side lateral overlap of the second source side halo implanted region (8058) with the second gate (8016).

A second drain side LDD implanted region (8060) and a second source side LDD implanted region (8062) are formed by the first LDD sub-implant, not shown in FIG. 8C for clarity, and the second LDD sub-implant, also not shown in FIG. 8C for clarity. Spatial distributions of LDD dopants in the second drain side LDD implanted region (8060) and the second source side LDD implanted region (8062) are established by the angles, doses and energies of the LDD sub-implants. Because the first and second LDD sub-implants are symmetric with respect to the left-right longitudinal axis of the second gate (8016), the second drain side LDD implanted region (8060) and the second source side LDD implanted region (8062) are substantially symmetric with respect to the second gate (8016). A drain side lateral overlap of the second drain side LDD implanted region (8060) with the second gate (8016) is substantially equal to a source side lateral overlap of the second source side LDD implanted region (8062) with the second gate (8016).

It will be recognized by those familiar with integrated circuit fabrication that the advantages of the embodiment discussed in reference to FIG. 8A through FIG. 8C may be realized by similar embodiments in which relative positions of drain and source areas are exchanged, with appropriate changes to angled sub-implants. It will also be recognized by those familiar with integrated circuit fabrication that the advantages of the embodiment discussed in reference to FIG. 8A through FIG. 8C may be realized by similar embodiments in which relative orientations of the asymmetric transistor (8010) and the symmetric transistor (8012) are exchanged, with appropriate changes to angled sub-implants.

What is claimed is:

1. An integrated circuit, comprising:
   a symmetric MOS transistor formed at said surface of said integrated circuit, said symmetric MOS transistor further comprising:
      a first MOS gate, said first MOS gate having a first longitudinal axis;
      a first source area, said first source area being located adjacent to said first MOS gate;
      a first drain area, said first drain area being located adjacent to said first MOS gate opposite from said first source area;
      a first source side implanted region in said first source area, wherein said first source side implanted region has a first source side lateral overlap with said first MOS gate; and
      a first drain side implanted region in said first drain area, wherein said first drain side implanted region has a first drain side lateral overlap with said first MOS gate, such that said first drain side lateral overlap is substantially equal to said first source side lateral overlap; and
   an asymmetric MOS transistor formed at said surface of said integrated circuit, said asymmetric MOS transistor further comprising:
      a second MOS gate, said second MOS gate having a second longitudinal axis perpendicular to said first longitudinal axis;
      a second source area, said second source area being located adjacent to said second MOS gate;
      a second drain area, said second drain area being located adjacent to said second MOS gate opposite from said second source area;
      a second source side implanted region in said second source area, wherein said second source side implanted region has a second source side lateral overlap with said second MOS gate; and
      a second drain side implanted region in said second drain area, wherein said second drain side implanted region has a second drain side lateral overlap with said second MOS gate, such that said second drain side lateral overlap is different from said second source side lateral overlap.

2. An integrated circuit, comprising:
a symmetric MOS transistor formed at said surface of said integrated circuit, said symmetric MOS transistor further comprising:
 a first MOS gate, said first MOS gate having a first longitudinal axis;
 a first source area, said first source area being located adjacent to said first MOS gate;
 a first drain area, said first drain area being located adjacent to said first MOS gate opposite from said first source area;
 a first source side implanted region in said first source area, wherein said first source side implanted region has a first source side lateral overlap with said first MOS gate; and
 a first drain side implanted region in said first drain area, wherein said first drain side implanted region has a first drain side lateral overlap with said first MOS gate, such that said first drain side lateral overlap is substantially equal to said first source side lateral overlap; and
an asymmetric MOS transistor formed at said surface of said integrated circuit, said asymmetric MOS transistor further comprising:
 a second MOS gate, said second MOS gate having a second longitudinal axis perpendicular to said first longitudinal axis;
 a second source area, said second source area being located adjacent to said second MOS gate;
 a second drain area, said second drain area being located adjacent to said second MOS gate opposite from said second source area;
 a second source side implanted region in said second source area, wherein said second source side implanted region has a second source side lateral overlap with said second MOS gate; and
 a second drain side implanted region in said second drain area, wherein said second drain side implanted region has a second drain side lateral overlap with said second MOS gate, such that said second drain side lateral overlap is different from said second source side lateral overlap;
a third source side implanted region located in said first source area, wherein said third source side implanted region has a third source side lateral overlap with said first MOS gate;
a third drain side implanted region located in said first drain area, wherein said third drain side implanted region has a third drain side lateral overlap with said first MOS gate, such that said third drain side lateral overlap is substantially equal to said third source side lateral overlap;
a fourth source side implanted region located in said second source area, wherein said fourth source side implanted region has a fourth source side lateral overlap with said second MOS gate; and
a fourth drain side implanted region located in said second drain area, wherein said fourth drain side implanted region has a fourth drain side lateral overlap with said second MOS gate, such that said fourth drain side lateral overlap is different from said fourth source side lateral overlap, wherein said third source side implanted region, said third drain side implanted region, said fourth source side implanted region and said fourth drain side implanted region each have a conductivity type opposite said first source side implanted region.

3. An integrated circuit, comprising:
a symmetric MOS transistor formed at said surface of said integrated circuit, said symmetric MOS transistor further comprising:
 a first MOS gate, said first MOS gate having a first longitudinal axis;
 a first source area, said first source area being located adjacent to said first MOS gate;
 a first drain area, said first drain area being located adjacent to said first MOS gate opposite from said first source area;
 a first source side implanted region in said first source area, wherein said first source side implanted region has a first source side lateral overlap with said first MOS gate; and
 a first drain side implanted region in said first drain area, wherein said first drain side implanted region has a first drain side lateral overlap with said first MOS gate, such that said first drain side lateral overlap is substantially equal to said first source side lateral overlap; and
an asymmetric MOS transistor formed at said surface of said integrated circuit, said asymmetric MOS transistor further comprising:
 a second MOS gate, said second MOS gate having a second longitudinal axis perpendicular to said first longitudinal axis;
 a second source area, said second source area being located adjacent to said second MOS gate;
 a second drain area, said second drain area being located adjacent to said second MOS gate opposite from said second source area;
 a second source side implanted region in said second source area, wherein said second source side implanted region has a second source side lateral overlap with said second MOS gate; and
 a second drain side implanted region in said second drain area, wherein said second drain side implanted region has a second drain side lateral overlap with said second MOS gate, such that said second drain side lateral overlap is different from said second source side lateral overlap;
a third source side implanted region located in said first source area, wherein said third source side implanted region has a third source side lateral overlap with said first MOS gate;
a third drain side implanted region located in said first drain area, wherein said third drain side implanted region has a third drain side lateral overlap with said first MOS gate, such that said third drain side lateral overlap is substantially equal to said third source side lateral overlap;
a fourth source side implanted region located in said second source area, wherein said fourth source side implanted region has a fourth source side lateral overlap with said second MOS gate; and
a fourth drain side implanted region located in said second drain area, wherein said fourth drain side implanted region has a fourth drain side lateral overlap with said second MOS gate, such that said fourth drain side lateral overlap is different from said fourth source side lateral overlap, wherein said third source side implanted region, said third drain side implanted region, said fourth source side implanted region and said fourth drain side implanted region each have a conductivity type opposite said first source side implanted region;

a first gate sidewall spacer formed on lateral surfaces of said first MOS gate;
a second gate sidewall spacer formed on lateral surfaces of said second MOS gate;
a fifth source side implanted region located in said first source area, wherein said fifth source side implanted region has a fifth source side lateral overlap with said first gate sidewall spacer;
a fifth drain side implanted region located in said first drain area, wherein said fifth drain side implanted region has a fifth drain side lateral overlap with said first gate sidewall spacer, such that said fifth drain side lateral overlap is substantially equal to said fifth source side lateral overlap;
a sixth source side implanted region located in said second source area, wherein said sixth source side implanted region has a sixth source side lateral overlap with said second gate sidewall spacer; and
a sixth drain side implanted region located in said second drain area, wherein said sixth drain side implanted region has a sixth drain side lateral overlap with said second gate sidewall spacer, such that said sixth drain side lateral overlap is different from said sixth source side lateral overlap.

* * * * *